United States Patent
Ode et al.

(10) Patent No.: US 6,657,493 B2
(45) Date of Patent: Dec. 2, 2003

(54) DISTORTION COMPENSATION APPARATUS AND DISTORTION COMPENSATION METHOD

(75) Inventors: Takayoshi Ode, Kawasaki (JP); Yasuyuki Oishi, Kawasaki (JP); Tokuro Kubo, Kawasaki (JP); Kazuo Nagatani, Kawasaki (JP); Hiroyoshi Ishikawa, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/116,633

(22) Filed: Apr. 4, 2002

(65) Prior Publication Data

US 2003/0080814 A1 May 1, 2003

(30) Foreign Application Priority Data

Oct. 31, 2001 (JP) ........................................ 2001-334577

(51) Int. Cl.$^7$ ................................................. H03F 1/26
(52) U.S. Cl. ........................ 330/149; 375/297; 455/63
(58) Field of Search ................................. 330/149, 151; 375/297; 455/63

(56) References Cited

U.S. PATENT DOCUMENTS

| | | | |
|---|---|---|---|
| 5,870,668 A | | 2/1999 | Takano et al. |
| 6,133,789 A | * | 10/2000 | Braithwaite ................. 330/149 |
| 6,236,286 B1 | * | 5/2001 | Hoffmann et al. ............. 330/2 |
| 6,493,543 B1 | * | 12/2002 | Shin et al. .................. 455/126 |

FOREIGN PATENT DOCUMENTS

| | | |
|---|---|---|
| JP | 06-310946 | 11/1994 |
| JP | 09-069733 | 3/1997 |
| JP | 2001-189685 | 7/2001 |
| JP | 2001-251148 | 9/2001 |
| JP | 2004-345718 | 12/2001 |
| JP | 2002-111401 | 4/2002 |
| JP | 2002-223130 | 8/2002 |
| WO | 01/08319 | 2/2001 |
| WO | 01/08320 | 2/2001 |

\* cited by examiner

*Primary Examiner*—Henry Choe
(74) *Attorney, Agent, or Firm*—Katten Muchin Zavis Rosenman

(57) ABSTRACT

A distortion compensation apparatus returns a part of an amplified output signal of a power amplifier amplifying a transmission signal, reads a distortion compensation signal from a distortion compensation table, multiplies the transmission signal with the distortion compensation signal thereof, and inputs the signal to the power amplifier. The distortion compensation signal corresponding to a signal calculated based on an error signal that is a difference between the transmission signal and the amplified output signal, the distortion compensation signal from the distortion compensation table and the step size parameter, and to a power of the transmission signal. The distortion compensation apparatus comprises a $\mu$ control part including a fast Fourier transformation part that obtains a spectrum of the amplified output signal, a calculation part that calculates an adjacent channel leakage power ratio based on the spectrum, and a $\mu$ adjusting part that varies the step size parameter by comparing the calculated adjacent leakage power ratio with a threshold value.

16 Claims, 23 Drawing Sheets

—— WITH DISTORTION COMPENSATION
------ WITHOUT DISTORTION COMPENSATION

DISTORTION COMPENSATION APPARATUS AND DISTORTION COMPENSATION METHOD

BACKGROUND OF THE INVENTION

1. Field of the Invention

The present invention relates to a distortion compensation apparatus and a distortion compensation method that compensate distortion of a power amplifier amplifying a transmission signal of a radio base station or the like by controlling an adjacent channel leakage power ratio to be small.

2. Description of the Related Art

In mobile communications systems to which W-CDMA (Wideband Code Division Multiple Access), PDC (Personal Digital Cellular) or the like is applied, it is necessary to control transmission power of a radio base station in a scope from approximately 10 mW to approximately 20 W, for example. As such a control means, transmission power control (TPC) such as an inner loop method, an open loop method, a closed loop method or the like is performed so as to control the power amplifier to obtain a desired transmission signal.

It is desirable to use the power amplifier that amplifies the transmitting signal in a linear region so as to make an amplification distortion small. However, in this case, power added efficiency is lowered to several percent and consumption of transmission power becomes large. The power added efficiency represents a ratio of a difference between the input power and output power to the input power. For example, in FIG. 1, an example of relationship among the output power [dBm], the power added efficiency [%] and the input power [dBm] is shown. A horizontal axis represents the input power [dBm], a left vertical axis represents the output power [dBm] and a right vertical axis represents the power added efficiency [%]. In FIG. 1, tendency of relationship between the output power and the power added efficiency is shown. That is, it is realized that the power added efficiency is very low when using only the linear region of the output power characteristics. Thus, a means has been employed in which the power added efficiency is improved by enabling the power amplifier to be used in a nonlinear region.

The amplification distortion becomes large when simply operating the power amplifier in the nonlinear region, causing leakage power to an adjacent channel to be large. Accordingly, a problem occurs in that an adjacent channel is interfered with. Thus, using a power amplifier having characteristics of wide linear region may be conceived. However, it is necessary to prepare the power amplifier having more capacity than required, thus an economical problem arises. Therefore, a structure using a linearizer (distortion compensation apparatus) compensating the distortion of the power amplifier has been in practical use.

For example, as shown in FIG. 2, when the distortion compensation is not performed, the transmission power characteristic is illustrated by a continuous curving line, and the leakage power to an adjacent channel between a one-dot chain line and a two-dot chain line becomes large. However, as shown by dotted lines, it is possible to reduce the leakage power to the adjacent channel by performing the distortion compensation.

In this case, an ACLR (Adjacent Channel Leakage Power Ratio) of the power which leaks to the adjacent channel to the transmitting power of the transmitting channel is equivalent to a ratio of an area of a spectrum between the one-dot chain lines representing the power of the transmission channel in FIG. 2 to an area of the spectrum between the one-dot chain line and the two-dot chain line representing the leakage power to the adjacent channel. This leakage power is strictly regulated so as to use frequency bands effectively since the leakage power becomes a noise component to the adjacent channel. Further, ACLR is the same as the ACPR (Adjacent Channel Power Ratio) used commonly.

Additionally, power of the channels adjacent to the transmission channel and power of the channels adjacent to the channels adjacent to the transmission signals are also regulated strictly. For example, in FIG. 3, P1 represents transmission power of a transmission band, PH1 represents leakage power to an adjacent channel having a higher frequency, PH2 represents leakage power to a channel having a further higher frequency, PL1 represents leakage power to an adjacent channel having a lower frequency, and PL2 represents the leakage power to a channel having a further lower frequency. A vertical axis represents power and a horizontal axis represents frequency. An adjacent channel leakage power ratio ACLR1 and the next adjacent channel leakage power ratio ACLR2 can be obtained by formulas as follows:

$$ACLR1 = PH1 \text{ (or } PL1)/P1$$

$$ACLR2 = PH2 \text{ (or } PL2)/P1$$

In this case, with regard to ACLR1, it is possible to take an average of PH1 and PL1 for a numerator of P1. Similarly, with regard to ACLR2, it is possible to take an average of PH2 and PL2 for a numerator of P1. In the following, ACLR1 and ACLR2 are referred to as ACLR other than a case where it is required to differentiate ACLR1 from ACLR2.

FIG. 4 is a schematic diagram showing a basic structure of the linealizer (distortion compensation apparatus) for performing the distortion compensation of the power amplifier. The linealizer includes a multiplier 110 which structures a pre-distortion part, an adaptive distortion compensation control part 111, a subtractor 112, and a power amplifier 113.

Additionally, f(p) represents a distortion function of the power amplifier 113. Illustrations of a directional coupler, a cymoscope and the like for branching a part of an amplified output signal of the power amplifier 113 are omitted.

The adaptive distortion compensation control part 111 receives a difference e(t) between the transmission signal x(t) and the amplified output signal. Then, the adaptive distortion compensation control part 111 inputs a distortion compensation signal to the multiplier 110. The distortion compensation signal thereof makes the difference e(t) become zero and corresponds to an amplitude or power of the transmission signal x(t). Thereby, a distortion in an opposite direction, that is, pre-distortion is given to the transmission signal x(t) so that the amplified output signal of the power amplifier 113 does not include a distortion component.

Additionally, the linealizer shown in FIG. 5 includes a multiplier 120, a distortion compensation signal memory 121, a distortion compensation signal generation part 122, a power amplifier 123 and a subtractor 124. The same as the basic structure shown in FIG. 4, the multiplier 120 gives the pre-distortion corresponding to a distortion function f(p) of the power amplifier 123 to the transmission signal x(t). Besides, the distortion compensation signal memory 121 stores a distortion compensation coefficient corresponding to a level or power of the transmission signal x(t). The distortion compensation signal generation part 122 receives the difference e(t) between the transmission signal x(t) and the amplified output signal so as to generate a distortion compensation signal, and updates the distortion compensation coefficient of the distortion compensation signal memory 121.

Furthermore, a structure of a linealizer (distortion compensation apparatus) shown in FIG. 6 is proposed in Japanese Laid-Open Patent Application No. 09-069733. In FIG. 6, the linealizer includes a multiplier 130, a distortion compensation table 131, a power calculation part ($|x(t)|^2$) 132, a power amplifier 133, a subtractor 134, a complex number converter (conjg) 135, multipliers 136 through 138, an adder 139 and a directional coupler 140. In addition, f(p) represents a distortion function of the power amplifier 133, x(t) represents the transmission signal, e(t) represents a difference between the transmission signal and a signal which is branched from the amplified output signal by the directional coupler 140, $\mu$ represents a step size parameter and y(t) represents an output signal of the power amplifier 133.

Assuming that h(p) is a distortion compensation coefficient of the distortion compensation table 131, x, y, f, h, u, e are complex numbers, and * is a complex conjugate number, the multiplier 137 outputs u*(t) by multiplying $h_{n-1}(p)$ with y*(t) which is obtained by branching an output signal y(t) of the power amplifier 133 by the directional coupler 140 and converting a value thereof into a complex conjugate number by the complex number converter 135. The multiplier 136 multiplies e(t) from the subtractor 134 and u*(t) from the multiplier 137. The multiplier 138 multiplies $\mu$ with e(t)·u*(t) from the multiplier 136. The adder 139 adds $h_{n-1}(p)$ and $\mu$·e(t)·u*(t). The distortion compensation coefficient $h_{n-1}(p)$ is calculated by the following formulas and the distortion compensation table 131 is updated.

$$h_n(p) = h_{n-1}(p) + \mu \cdot e(t) \cdot u^*(t) \quad (1)$$

$$e(t) = x(t) - y(t) \quad (2)$$

$$u(t) = x(t) \cdot f(p) = h^*_{n-1}(p) \cdot y(t) \quad (3)$$

$$h_{n-1}(p) \cdot h^*_{n-1}(p) = 1 \quad (4)$$

$$y(t) = h_{n-1}(p) \cdot x(t) \cdot f(p) \quad (5)$$

$$p = |x(t)|^2 \quad (6)$$

Thus, the distortion compensation coefficient $h_n(p)$, which updates the distortion compensation table 131, is obtained by a formula as follows:

$$h_n(p) = \mu \cdot y^*(t) \cdot h^*_{n-1}(p) \cdot e(t) + h^*_{n-1}(p)$$

In this case, assuming $y^*(t) \cdot h^*_{n-1}(p) = u^*(t)$, then the formula (1) is established. Additionally, a value of the formula (6) calculated by the power calculation part 132 becomes an address of the distortion compensation table 131, and the distortion compensation table 131 is updated by a result of the formula (1). Further, right side of the formula (4) is set to approximately 1 assuming that the amplification distortion of the power amplifier 133 is not large. Furthermore, by such a distortion compensation control, it is possible to reduce the leakage power to an adjacent band when operating the power amplifier 133 in the nonlinear region.

In the structure shown in the above-described FIG. 6, the step size parameter $\mu$ is set to be fixed in advance. When this step size parameter $\mu$ is set to be large, a convergence of the distortion compensation control has a tendency to be fast. However, there is a problem in that stability of the control is deteriorated. On the contrary, when the step size parameter $\mu$ is set to be small, there is a problem in that the convergence of the distortion compensation control becomes late. In this way, the step size parameter $\mu$ is determined by trade-off of the speed and stability of the convergence. That is, when the step size parameter $\mu$ is set. wrong, there is a problem in that the convergence time of the distortion compensation becomes long, or the distortion compensation control operates unstably.

SUMMARY OF THE INVENTION

Accordingly, it is a general object of the present invention to provide a novel and useful distortion compensation apparatus and distortion compensation method, in which the problems described above are eliminated.

Another object of the present invention is to adaptively control the step size parameter of the distortion compensation so as to realize the. convergence at high-speed and with stability after the convergence.

In order to achieve the above-mentioned objects, there is provided according to one aspect of the present invention, a distortion compensation apparatus that returns a part of amplified output signal of a power amplifier amplifying a transmission signal, reads a distortion compensation signal from a distortion compensation table, the distortion compensation signal corresponding to a signal calculated based on an error signal that is a difference between the transmission signal and the amplified output signal, a distortion compensation signal from the distortion compensation table and the step size parameter, and to a power of the transmission signal, multiplies the transmission signal with the distortion compensation signal thereof, and input the signal to the power amplifier, comprising a $\mu$ control part including a fast Fourier transformation part that obtains a spectrum of the amplified output signal, a calculation part that calculates an adjacent channel leakage power ratio and the like based on the spectrum, and a $\mu$ adjusting part that switches the step size parameter by comparing the calculated adjacent leakage power ratio with a threshold value.

Additionally, there is provided according to another aspect of the present invention, a distortion compensation apparatus that returns a part of an amplified output signal of a power amplifier amplifying signals of a plurality of carriers by a first combining part, reads a distortion compensation signal corresponding to a signal calculated based on an error signal of a difference between the returned signal and a transmission signal obtained by combining the transmission signals of the plurality of carriers by a second combining part, a distortion compensation signal from a distortion compensation table and a step size parameter, and to a power of the transmission signal combined by the second combining signal, multiplies the transmission signal with the distortion compensation signal thereof, adds the transmission signal combined by the first combining part to a compensation signal, the compensation signal being a difference between the multiplied output signal and the transmission signal combined by the second combining part, and inputs the signal thereof to the power amplifier, comprising a $\mu$ control part including a fast Fourier transformation part that obtains a spectrum of the amplified output signal, a calculation part that calculates an adjacent channel leakage power ratio based on the spectrum, and a $\mu$ adjusting part that switches the step size parameter by comparing the calculated adjacent channel leakage power ratio with a threshold value.

Additionally, there is provided according to another aspect of the present invention, a distortion compensation method that returns a part of an amplified output signal of a power amplifier amplifying a transmission signal, reads a distortion compensation signal from a distortion compensation table, the distortion compensation signal corresponding to a signal calculated based on an error signal that is a difference between the transmission signal and the amplified output signal, a distortion compensation signal from the distortion compensation table and the step size parameter, and to a power of the transmission signal, multiplies the transmission signal with the distortion compensation signal thereof, and input the signal to the power amplifier, comprising the steps of: obtaining a spectrum of the amplified output signal; calculating an adjacent channel leakage power ratio based on the spectrum; comparing the adjacent channel leakage power ratio with a threshold value; and switching the step size parameter to a small value when the adjacent channel leakage power ratio becomes smaller than the threshold value.

Additionally, there is provided according to another aspect of the present invention, a distortion compensation apparatus that returns a part of an amplified output signal of a power amplifier amplifying signals of a plurality of carriers by a first combining part, reads a distortion compensation signal corresponding to a signal calculated based on an error signal of a difference between the returned signal and a transmission signal obtained by combining the transmission signals of the plurality of carriers by a second combining part, a distortion compensation signal from a distortion compensation table and a step size parameter, and to a power of the transmission signal combined by the second combining signal, multiplies the transmission signal with the distortion compensation signal thereof, adds the transmission signal combined by the first combining part to a compensation signal, the compensation signal being a difference between the multiplied output signal and the transmission signal combined by the second combining part, inputs the signal thereof to the power amplifier, comprising the steps of: obtaining a spectrum of the amplified output signal; calculating an adjacent channel leakage power ratio based on the spectrum; comparing the calculated adjacent channel leakage power ratio with a threshold value; and switching the step size parameter.

According to the present invention, since the step size parameter ($\mu$) in the distortion compensation control is switched by comparing the calculated adjacent channel leakage power ratio at the time t (ACLRt) with the threshold value, it is possible to realize convergence with higher speed at the beginning stage of the distortion compensation control by making a value of the step size parameter ($\mu$) large, and to realize convergence stably after the convergence by making the value of the step size parameter ($\mu$) small.

Further, by setting an initial value of the step size parameter ($\mu$) corresponding to a desired transmission power value, it is possible to make the convergence of the distortion compensation control faster when the transmission power value is small. Additionally, since the step size parameter ($\mu$) can be suitably varied according to a status of distortion compensation control by setting the threshold value for comparing with the adjacent channel leakage power ratio (ACLRt) to a value corresponding to the adjacent channel leakage power ratio (ACLRt) and further to the transmission power value, there is an advantage in that it is possible to control the distortion compensation toward the convergence state stably and with high speed.

Other objects, features and advantages of the present invention will become more apparent from the following detailed description when read in conjunction with the following drawings.

DETAILED DESCRIPTION OF THE PREFERRED EMBODIMENTS

Figure 7:
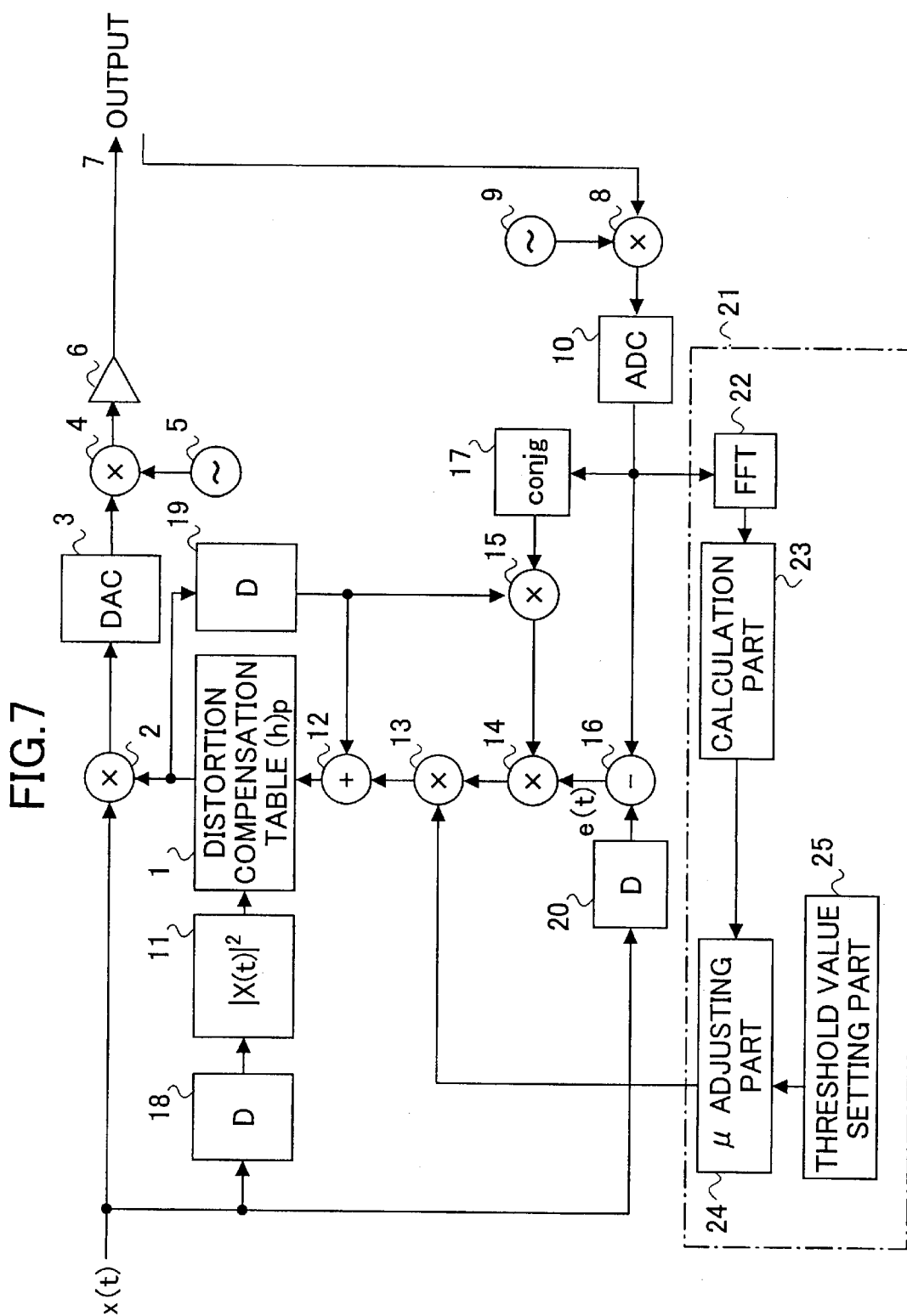
FIG. 7 is a block diagram of a first embodiment of the present invention.

FIG. 7 is an explanatory diagram of a first embodiment of the present invention. A distortion compensation apparatus in FIG. 7 includes a distortion compensation table 1, a multiplier 2, a D/A converter (DAC) 3, a frequency converter 4, a local oscillator 5, a power amplifier 6, a directional coupler 7, a frequency converter 8, a local oscillator 9, an A/D converter (ADC) 10, a power calculation part ($|x(t)_2|$) 11, an adder 12, multipliers 13 through 15, a subtractor 16, a complex number converter (conjg) 17, delay circuits (D) 18 through 20, and a step size parameter control part 21, which is referred to as a $\mu$ control part hereafter. In addition, the distortion compensation apparatus includes a fast Fourier transformation part (FFT) 22 and a leakage power ratio calculation part 23, which is referred to as a calculation part 23 for calculating ACLR and the like hereafter. Additionally, the distortion compensation apparatus has an adjustment part 24 that adjusts the step size parameter. The adjustment part 24 is referred to as a $\mu$ adjustment part hereafter. Further, the distortion compensation apparatus has a threshold value setting part 25. In the following, a description will be given using $\mu$ as the step size parameter. In addition, it is possible to use other moduli.

A digital transmission signal x(t) is input to the multiplier 2, the power calculation part 11 via the delay circuit 18, and the subtractor 16 via the delay circuit 20. Then, a predistortion is given to the transmission signal x(t) by inputting a distortion compensation coefficient h(p) (distortion compensation signal) from the distortion compensation table 1 to the multiplier 2 and multiplying the transmission signal x(t) by the distortion compensation coefficient h(p). The thus obtained signal is converted into an analog signal by the D/A converter 3, combined with a signal from the local oscillator 5 by the frequency converter 4. Then, the signal is amplified by the power amplifier 6 and transmitted from an antenna of which the illustration is omitted.

Additionally, a part of the amplified output signal of the power amplifier 6 is returned by the directional coupler 7. The frequency converter 8 combines the returned signal with a signal from the local oscillator 9 and performs a frequency conversion to the signal thereof. Then, the signal is converted into a digital signal by the A/D converter 10. The thus obtained signal is input to the subtractor 16, the complex number converter 17 and the $\mu$ control part 21.

The subtractor 16 obtains an error signal e(t) that is a difference between the transmission signal x(t) and the returned signal r(t) of the amplified output signal of the power amplifier 6. The delay circuit 20 compensates for a delay time of a return path including the A/D converter and the like. Additionally, a complex conjugate signal t(t)* of a signal t(t) provided by the complex number converter 17 is multiplied by the distortion compensation coefficient $h_{t-1}(p)$ (distortion compensation signal) read from the distortion compensation table 1 at a time t−1 (delayed by the delay circuit 19 with respect to a time t) by the multiplier 15. The multiplied output signal thereof is multiplied by the error signal e(t) by the multiplier 14. This multiplied output signal is multiplied by the step size parameter $\mu$ from $\mu$ control part 21 by the multiplier 13. Then, the adder 12 adds the multiplied output signal of the multiplier 13 and the above-mentioned distortion compensation coefficient $h_{t-1}(p)$ read from the distortion compensation table 1. By accessing the distortion compensation table 1 based on thus obtained added output signal and the transmission power from the power calculation part 11, the distortion compensation coefficient $h_t(p)$ at the time t is input to the multiplier 2. The transmission signal x(t) is multiplied with the distortion compensation coefficient $h_t(P)$ so as to include the predistortion, and is amplified by the power amplifier 6.

Figure 1:
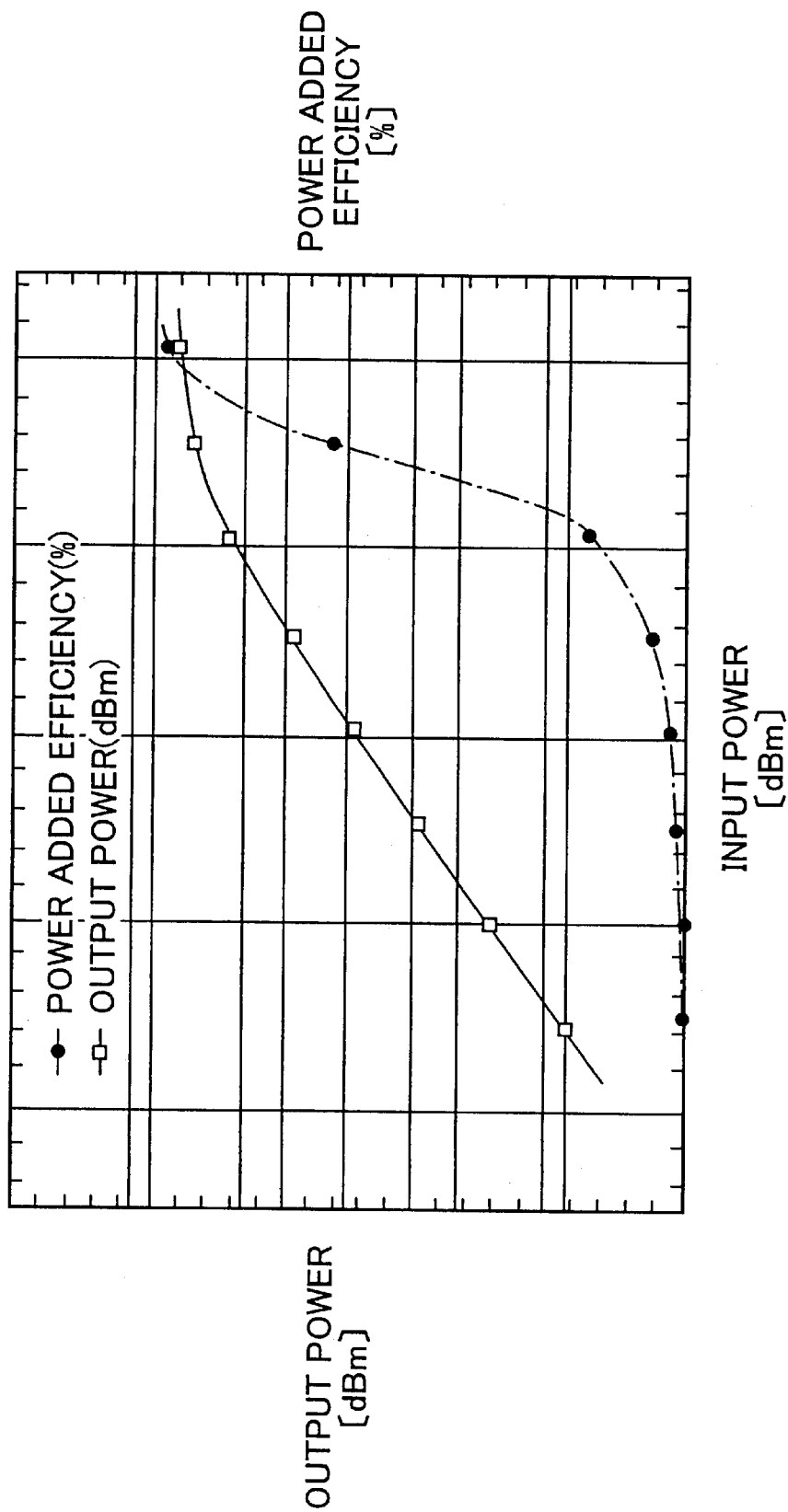
FIG. 1 is a graph for illustrating characteristics of an example of a power amplifier.
Figure 2:
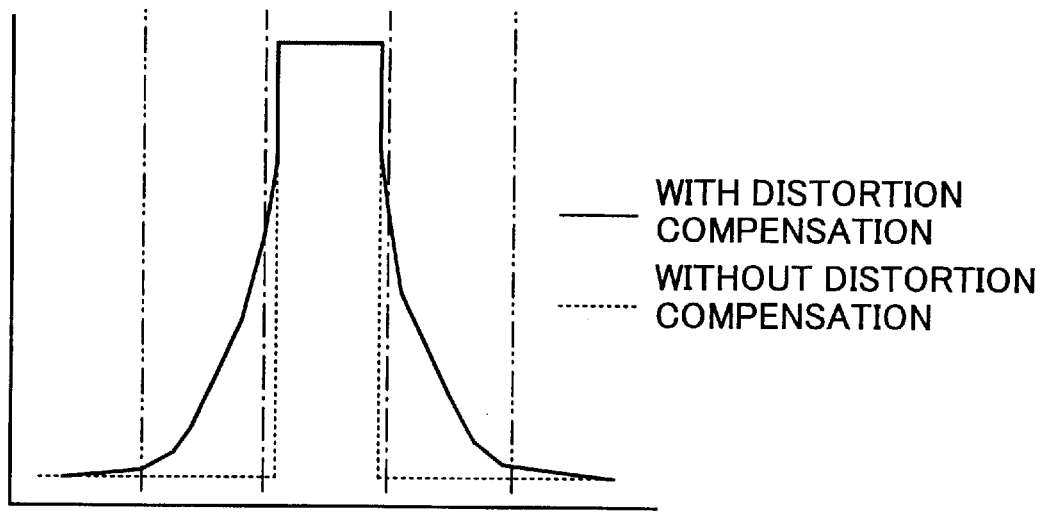
FIG. 2 is a graph for explaining adjacent channel leakage power and distortion compensation.
Figure 3:
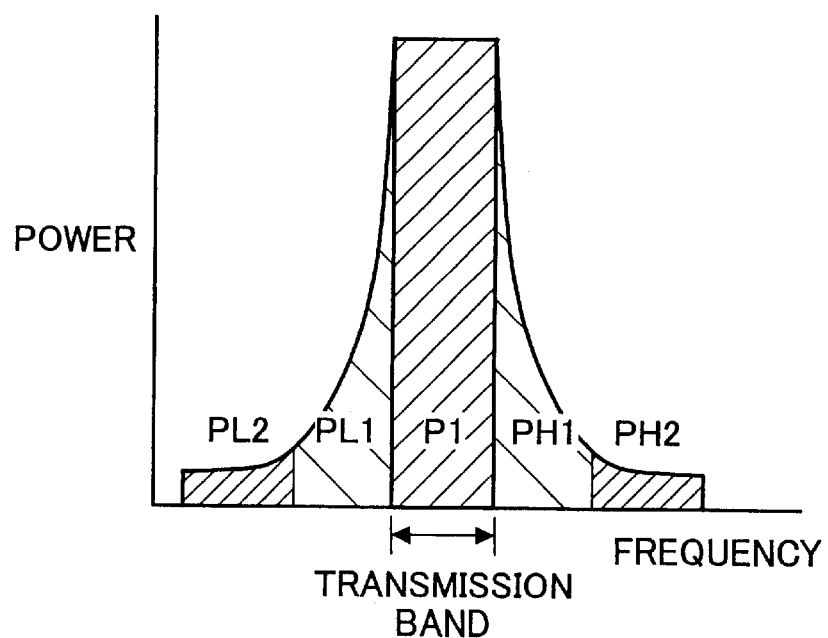
FIG. 3 is a graph for explaining ACLR (adjacent channel leakage power ratio)
Figure 4:
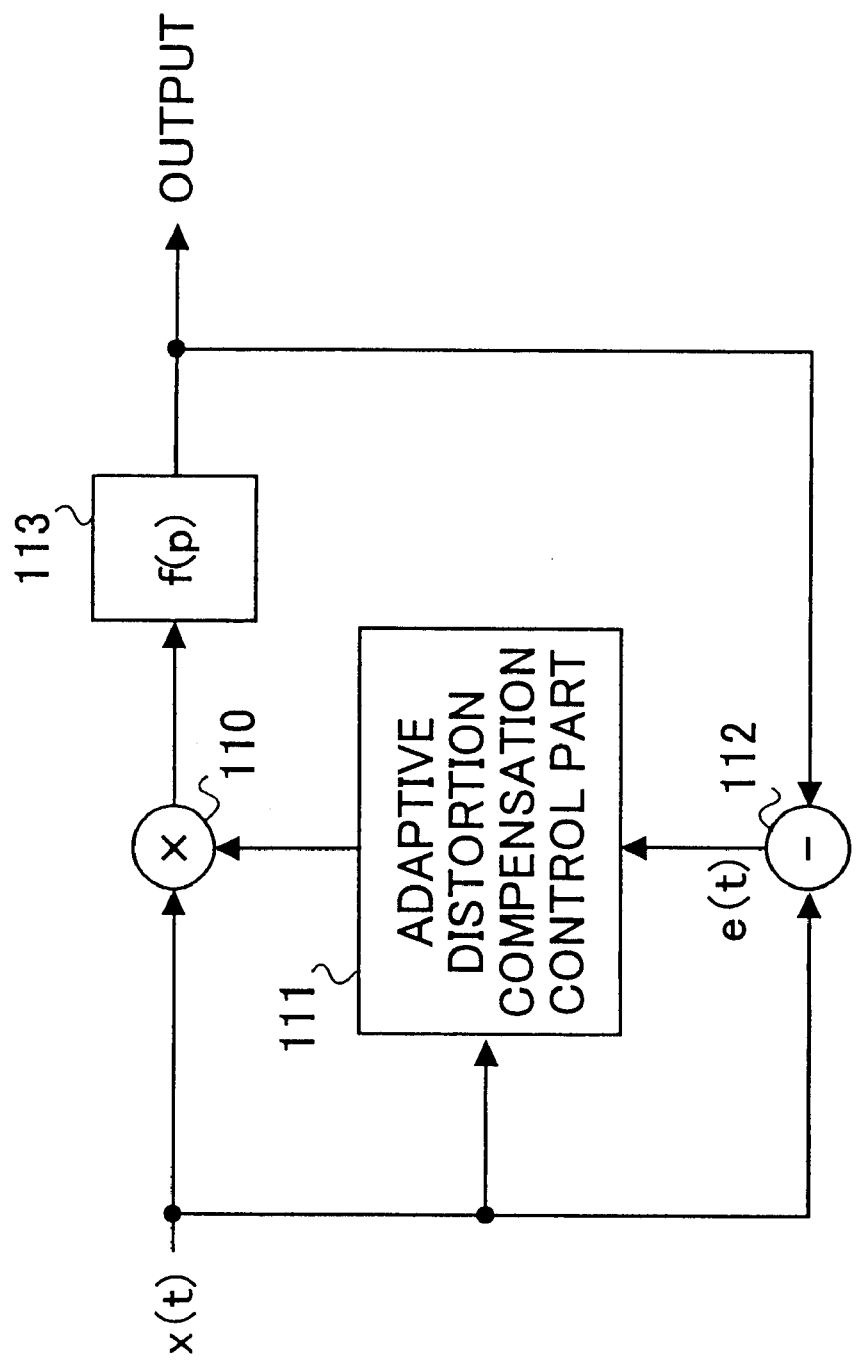
FIG. 4 is a block diagram of a basic structure of a linealizer of a related art.
Figure 5:
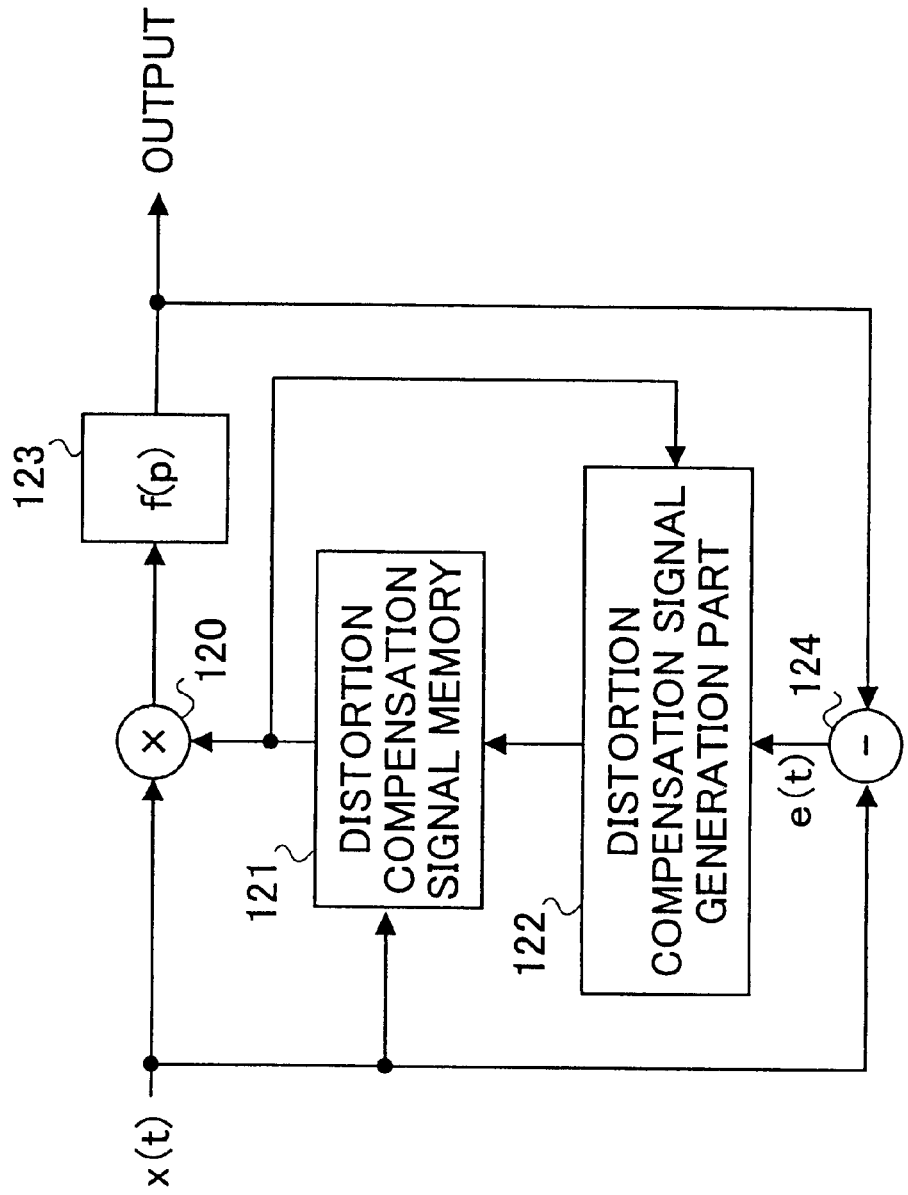
FIG. 5 is a block diagram of another linealizer of a related art.
Figure 6:
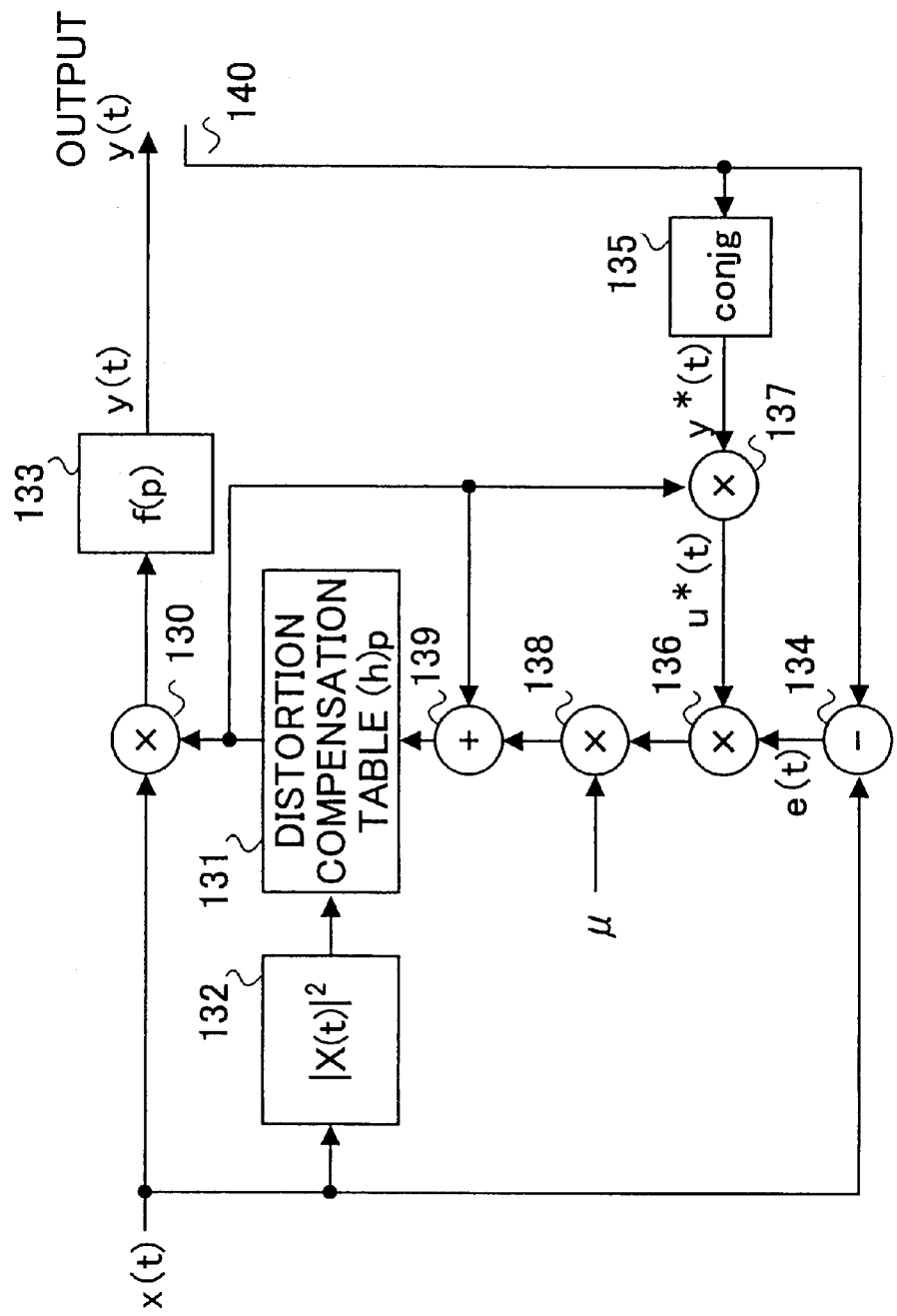
FIG. 6 is a block diagram of another linealizer of a related art.

The above mentioned structure including the distortion compensation table 1, the multipliers 2 and 13 through 15, the power calculation part 11, the adder 12 and the complex number converter 17 has the same function as the linealizer shown in FIG. 6. Additionally, the delay circuits 18 and 19 are the same as the delay circuit 20, for setting respective time. Further, the $\mu$ control part 21 has a structure including the fast Fourier transformation part 22, the calculation part 23, the $\mu$ adjusting part 24 and the threshold value setting part 25. The fast Fourier transformation part 22 stores a plurality of sampling points, 1024 sampling points, for example, of a digital signal from the A/D converter 10, and converts the sampling points on a frequency axis. Thereby, the spectrum shown in FIG. 3, for example, is obtained. In this case, it is possible to perform a Fourier transformation process every determined time ta to obtain an average value of respective points of 1024 points, or to perform an averaging process of the spectrum obtained by the Fourier transformation process.

Assuming that a transmission band is 5 MHz, for example, the calculation part 23 obtains power P1 in a scope of ±2.5 MHz of a center frequency based on the spectrum. Additionally, power PH1 in a scope of 5 MHz and having a higher frequency than the transmission band and power PH2 in a scope of 5 MHz and having a further higher frequency, are calculated. Additionally, power PL1 in a scope of 5 MHz and having a lower frequency than the transmission band and power PL2 in a scope of 5 MHz and having a further lower frequency are calculated. In this way, an accurate ACLR is obtained by calculating the adjacent channel leakage power based on the spectrum. As mentioned above, the ACLR in this case can also be obtained by using only PH1 or PL1. Further, it is also possible to obtain the ACLR based on an average value of PH1 and PL1. In addition, the ACLR can be obtained by also using PH2 and PL2.

Additionally, the $\mu$ adjusting part 24 switches the step size parameter $\mu$ by comparing the ACLR calculated by the calculation part 23 and the threshold value which is set to the threshold value setting part 25. That is, when the ACLR is larger than the threshold value, since the distortion compensation control is not converged, the step size parameter $\mu$ is set to be larger. When the ACLR is smaller than the threshold value, by determining that the distortion compensation control is converged, the step size parameter $\mu$ is set to be small. The step size parameter $\mu$ can be, for example, $\mu=1/2^n$ (n: integer including zero), and the multiplier 13 can be structured as a shifter so as to perform bit shift according to the step size parameter $\mu$. Thereby, it is possible to realize the convergence at high-speed and with stabilization of the convergence of the distortion compensation control.

Figure 8:
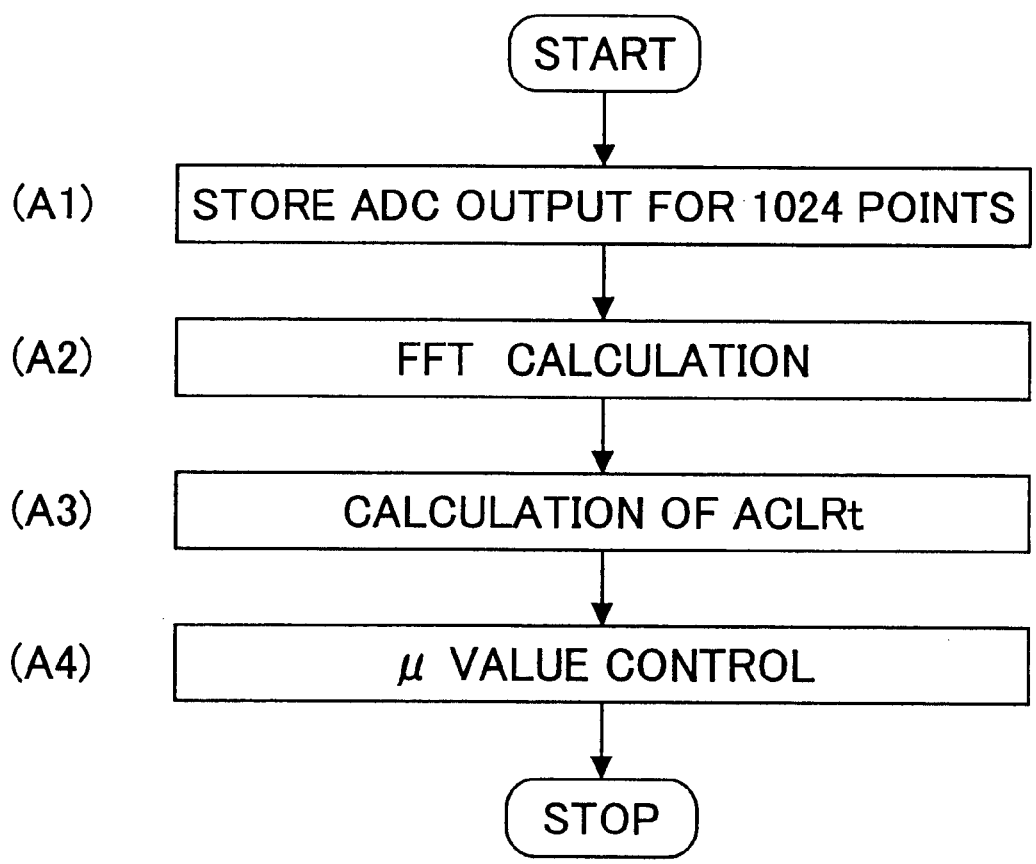
FIG. 8 is a schematic flow chart of the first embodiment of the present invention.

FIG. 8 shows a schematic flow chart of the first embodiment of the present invention. The fast Fourier transformation part (FFT) 22 stores 1024 outputs from the A/D converter 10 corresponding to 1024 sampling points, for example (A1). Then, the FFT calculation is performed (A2). Based on a spectrum of the result thereof, the adjacent channel leakage power ratio at a time t ACLRt is calculated (A3). Based on this ACLRt, the $\mu$ adjusting part 24 controls the step size parameter $\mu$ by comparing with the threshold value set in the threshold value setting part 25 (A4).

Figure 9:
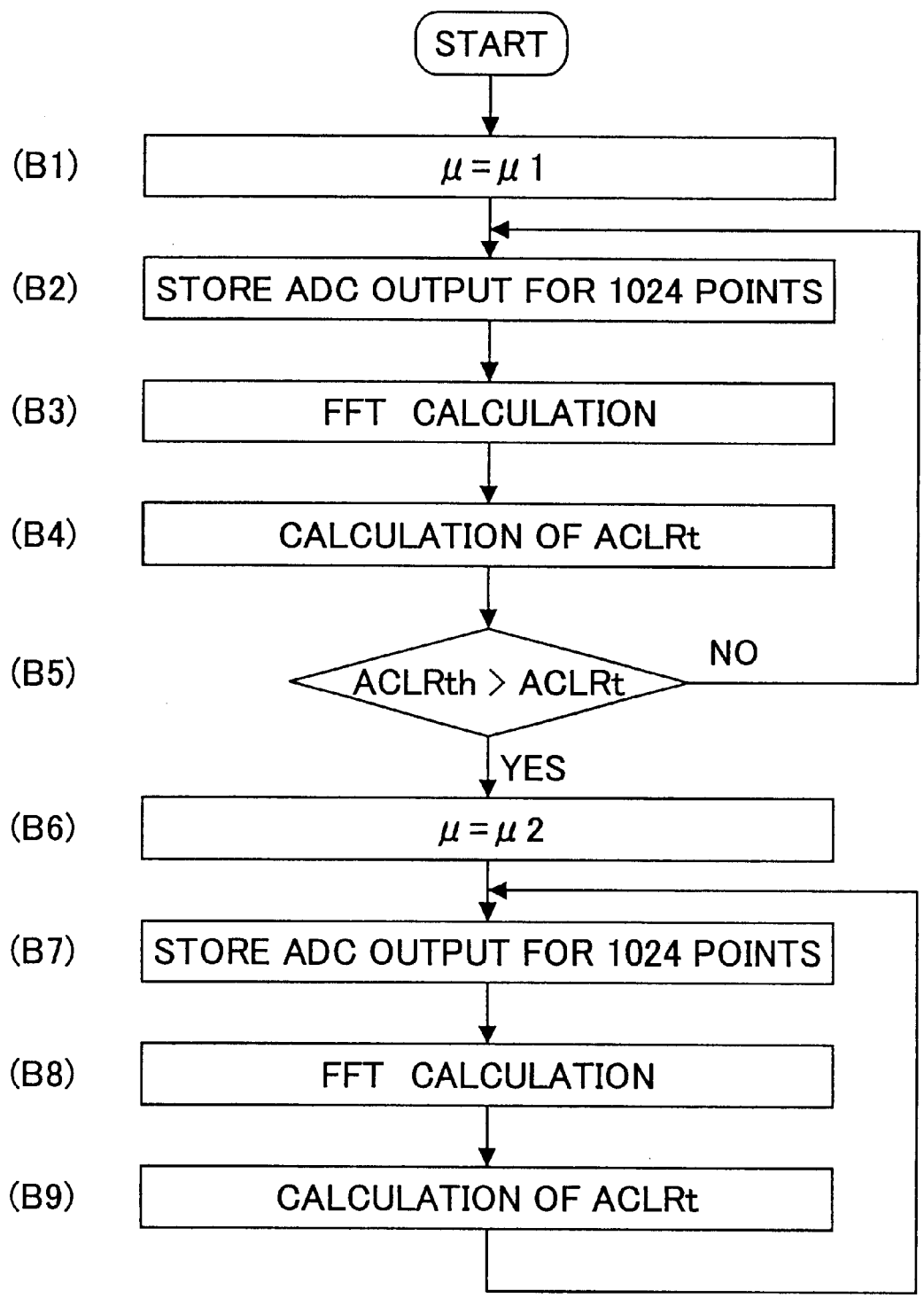
FIG. 9 is another flow chart of the first embodiment of the present invention.

FIG. 9 is a flow chart of the first embodiment of the present invention. The flow chart shows a case where the step size parameter $\mu$ is switched to $\mu 1$ and $\mu 2$ ($\mu 1 > \mu 2$). First, when starting the distortion compensation control, the step size parameter $\mu$ is set to $\mu 1$ in the $\mu$ adjusting part 24 (B1). The fast Fourier transformation part 22 stores the 1024 outputs from the A/D converter 10 corresponding to 1024 sampling points (B2), and performs an FFT calculation (B3). Based on a spectrum of the result of the FFT calculation, the calculation part 23 calculates ACLRt (B4). The $\mu$ adjusting part 24 compares this ACLRt and the threshold value ACLRth from the threshold value setting part 25 (B5).

When the calculated ACLRt is larger than the threshold value ACLRth, the step size parameter $\mu$ remains $\mu$1, and steps (B2) through (B4) are repeated. Then, when the calculated ACLRt becomes smaller than the threshold value ACLRth, the step size parameter $\mu$ is switched to $\mu$2 by determining that the distortion compensation control is converged to some extent (B6). Then, the distortion compensation control continues by repeating steps (B7) through (B9), which are the same as steps (B2) through (B4). Accordingly, the step size parameter $\mu$1 realizes the speeding up of the convergence of the distortion compensation control, and the step size parameter $\mu$2 realizes stable distortion compensation control.

Figure 10:
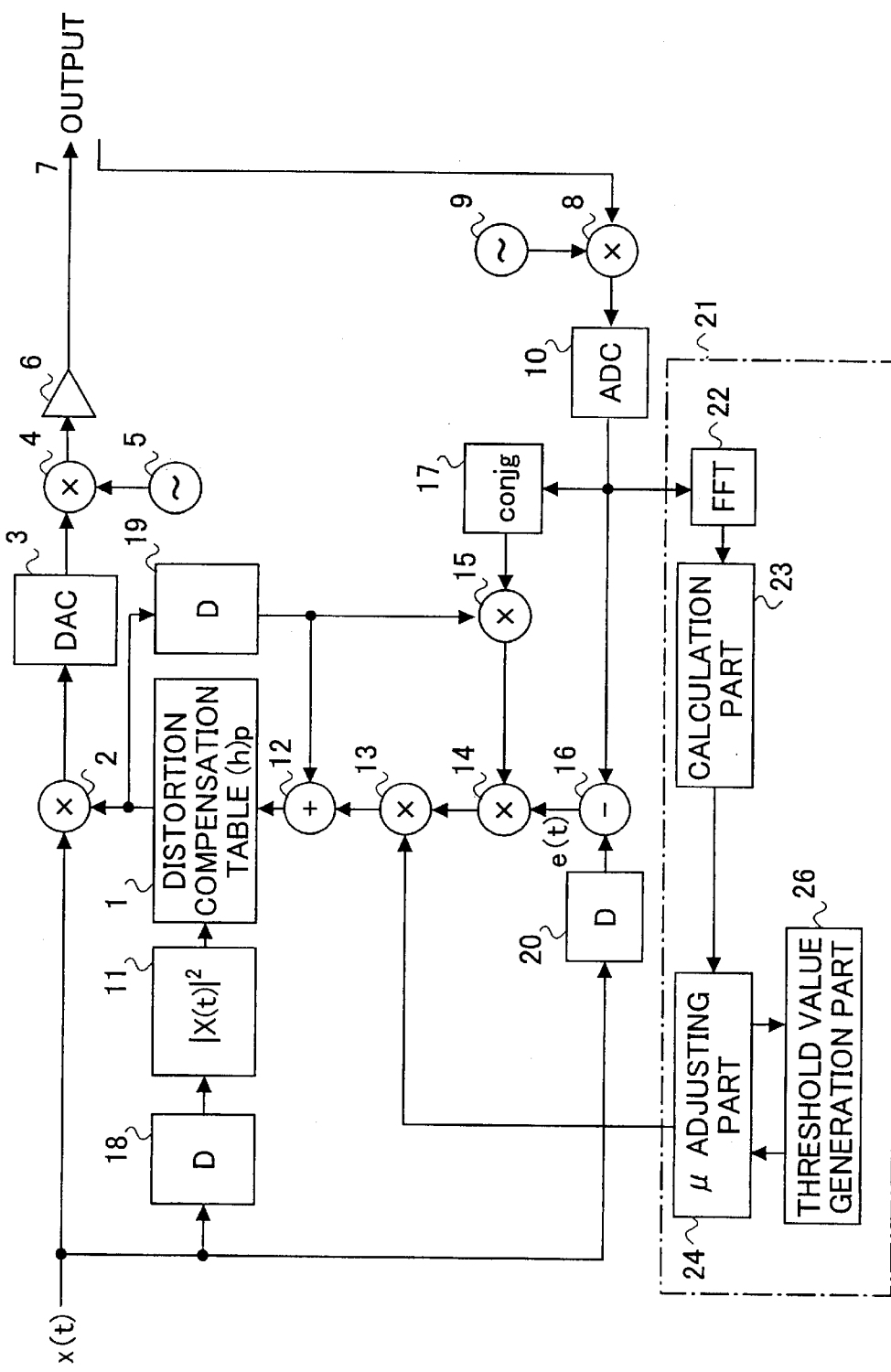
FIG. 10 is a block diagram of a second embodiment of the present invention.

FIG. 10 is an explanatory diagram of a second embodiment of the present invention. In FIG. 10, those parts which are designated by the same reference numerals in FIG. 7 correspond to the same parts in FIG. 7. Thus, an overlapping explanation of the parts having the same function will be omitted. Additionally, a threshold value generation part is indicated by a reference numeral 26. The threshold value generation part 26 may be a function generator which has a function of generating the threshold value as a function of ACLR, or a table from which the threshold value is read regarding a calculated ACLR as an address. Therefore, the $\mu$ adjusting part 24 can select a step size parameter corresponding to a value of the calculated ACLR from a plurality of step size parameters $\mu$, and can input the step size parameter to the multiplier 13.

Figure 11:
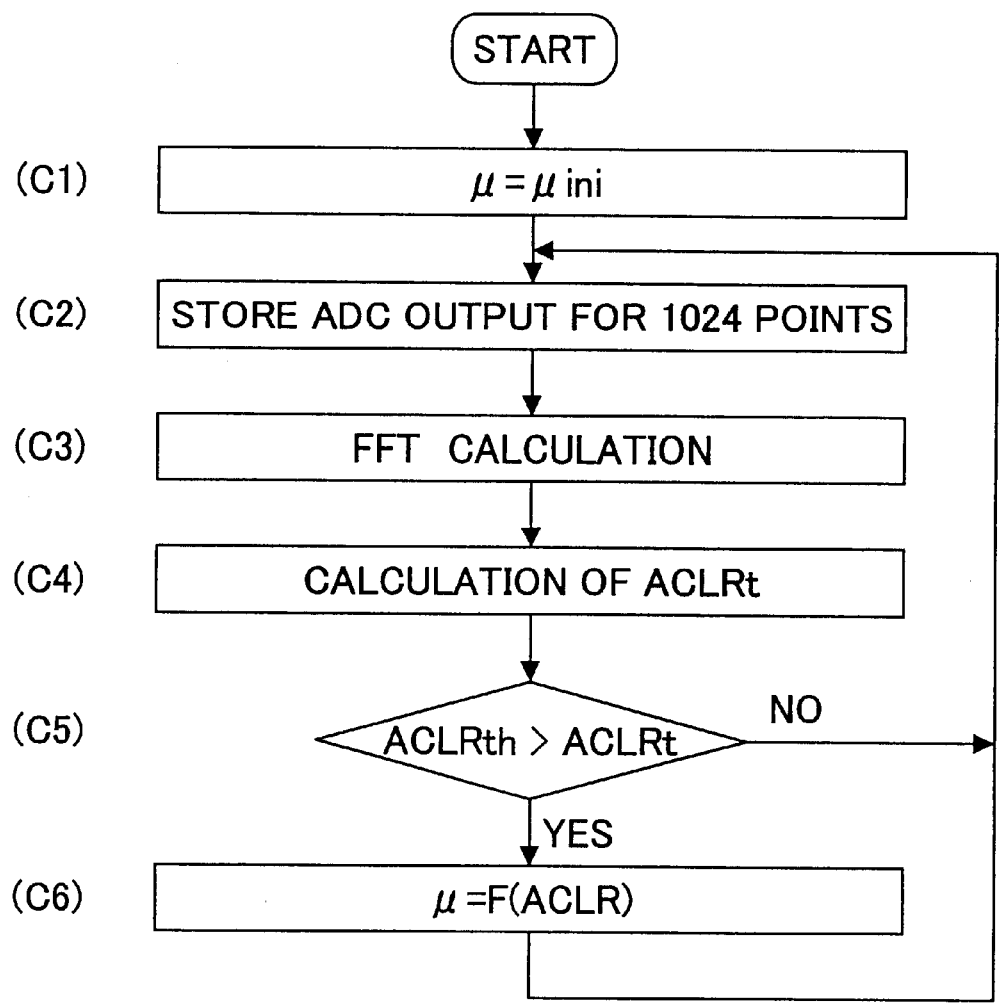
FIG. 11 is a flow chart of the second embodiment of the present invention.

FIG. 11 is a flow chart of the second embodiment of the present invention, and the step size parameter $\mu$ is set to an initial value ($\mu=\mu$ini) (C1). The initial value can be the maximum value of the step size parameter $\mu$. Then, the fast Fourier transformation part 22 stores 1024 outputs with regard to the digital signal from the A/D converter 10 (C2) corresponding to 1024 sampling points, and performs the FFT calculation (C3). The calculation part 23 calculates ACLRt based on a spectrum obtained by the FFT calculation (C4). The $\mu$ adjusting part 24 compares the calculated ACLRt with a corresponding threshold value ACLRth. When the calculated ACLRt becomes smaller than the threshold value ACLRth, the $\mu$ adjusting part 24 inputs the step size parameter $\mu$ to the multiplier 13, regarding the step size parameter $\mu$ as a value according to a function F(ACLR).

Figure 12:
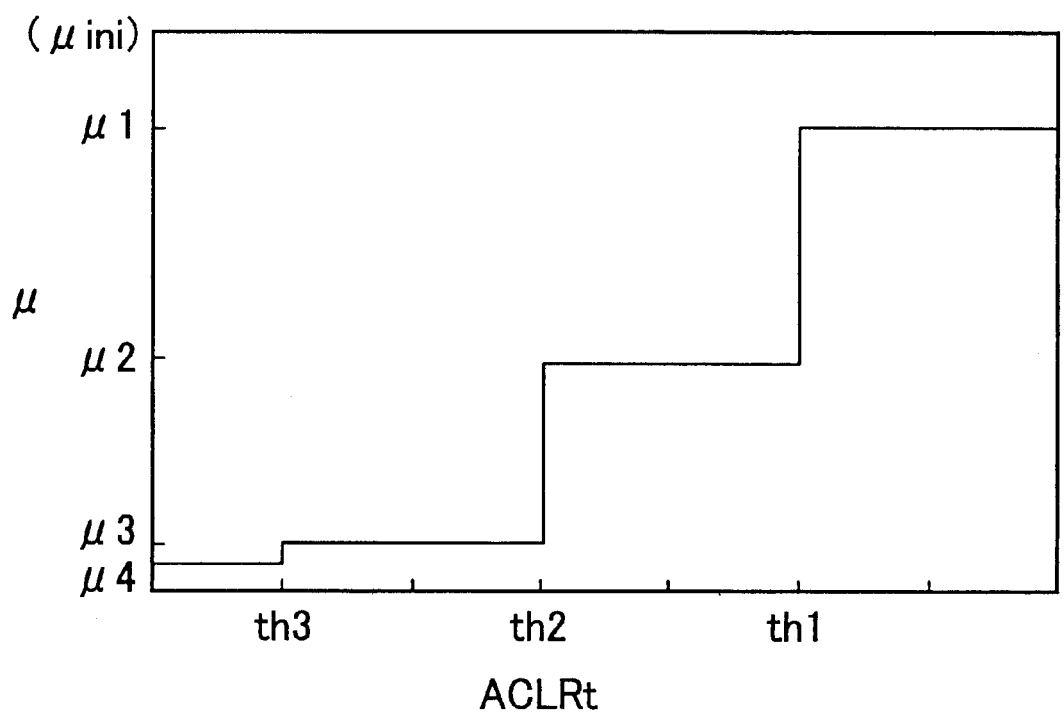
FIG. 12 is a graph for illustrating the relationship between a step size parameter $\mu$ and ACLRt (adjacent channel leakage power ratio at a time t)

FIG. 12 shows an example of a function for switching the step size parameter $\mu$ according to the function F(ACLR). In this case, the threshold value is set to th1>th2>th3, the step size parameter $\mu$ is set to $\mu$1>$\mu$2>$\mu$3>$\mu$4, and an initial condition is set to $\mu$ini=$\mu$1, for example. That is, the threshold value generation part 26 inputs the threshold value th1, th2 and th3 corresponding to ACLRt to the $\mu$ adjusting part 24. Additionally, in the initial condition, since ACLRt>th1 is established, the $\mu$ adjusting part 24 selects and inputs the largest step size parameter $\mu$1 as the initial value $\mu$ini to the multiplier 13.

When ACLRt becomes smaller than the threshold value th1 as the distortion compensation control progresses, and a relationship th1>ACLRt>th2 is established, the $\mu$ adjusting part 24 switches the step size parameter $\mu$ from $\mu$1 to $\mu$2. When the ACLRt further becomes smaller and a relationship th2>ACLRt>th3 is established, the $\mu$ adjusting part 24 switches the step size parameter $\mu$ from $\mu$2 to $\mu$3. When the ACLRt further becomes smaller and th3>ACLRt is established, the $\mu$ adjusting part 24 switches the step size parameter $\mu$ from $\mu$3 to $\mu$4. Such a state can be determined as a state where the distortion compensation control is converged.

Furthermore, although a case is shown where the step size parameter $\mu$ is selected from four types ($\mu$1, $\mu$2, $\mu$3 and $\mu$4) in this embodiment, it is also possible to switch the step size parameter $\mu$ to more types. Additionally, it is possible to select the step size parameter $\mu$ linearly or curvilinearly according to the size of ACLRt as well as to switch the step size parameter $\mu$ to a plurality of steps. In this way, by sequentially switching the step size parameter $\mu$ according to the convergence process of the distortion compensation control, it is possible to realize the stabilization as well as speeding up of the convergence.

Figure 13:
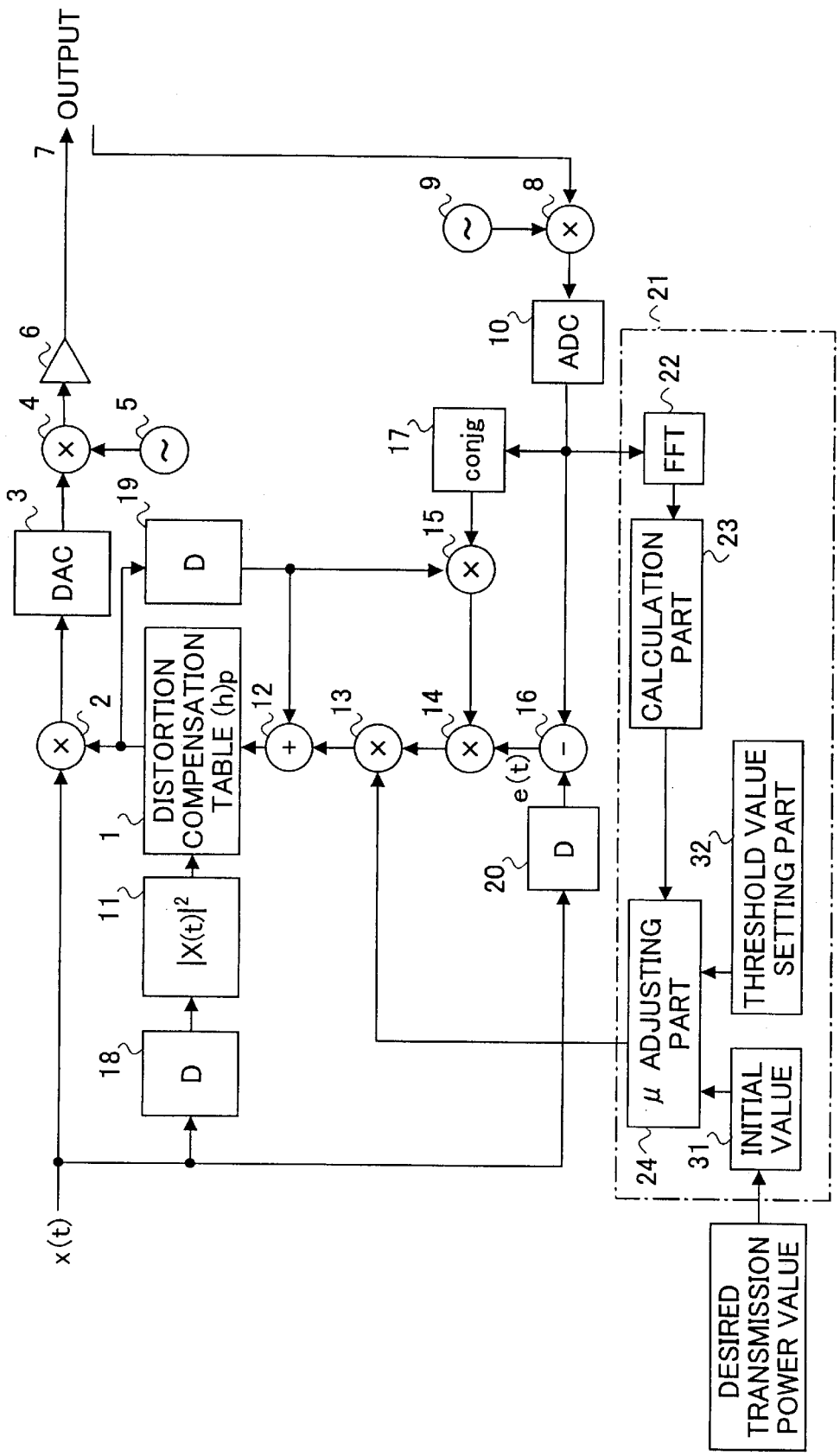
FIG. 13 is a block diagram of a third embodiment of the present invention.

FIG. 13 is an explanatory diagram of a third embodiment of the present invention. In FIG. 13, those parts which are designated by the same reference numerals in FIGS. 7 and 10 correspond to the same parts in FIGS. 7 and 10. Thus, an overlapping explanation of the parts having the same function will be omitted. In this embodiment, the $\mu$ adjusting part 21 includes a initial value setting part 31 and a threshold value setting part 32. The initial value setting part 31 sets the step size parameter $\mu$ to the initial value when a desired transmission power value is varied. That is, in the transmission power control, since an upper layer orders the transmission power value corresponding to the number of channels or the like, the initial value setting part 31 returns the step size parameter $\mu$ to the initial value and resumes the distortion compensation control when the transmission power value is varied. In addition, the threshold value setting part 32 can have the same function as the threshold value setting part or the threshold value generation part in the embodiments described above.

Figure 14:
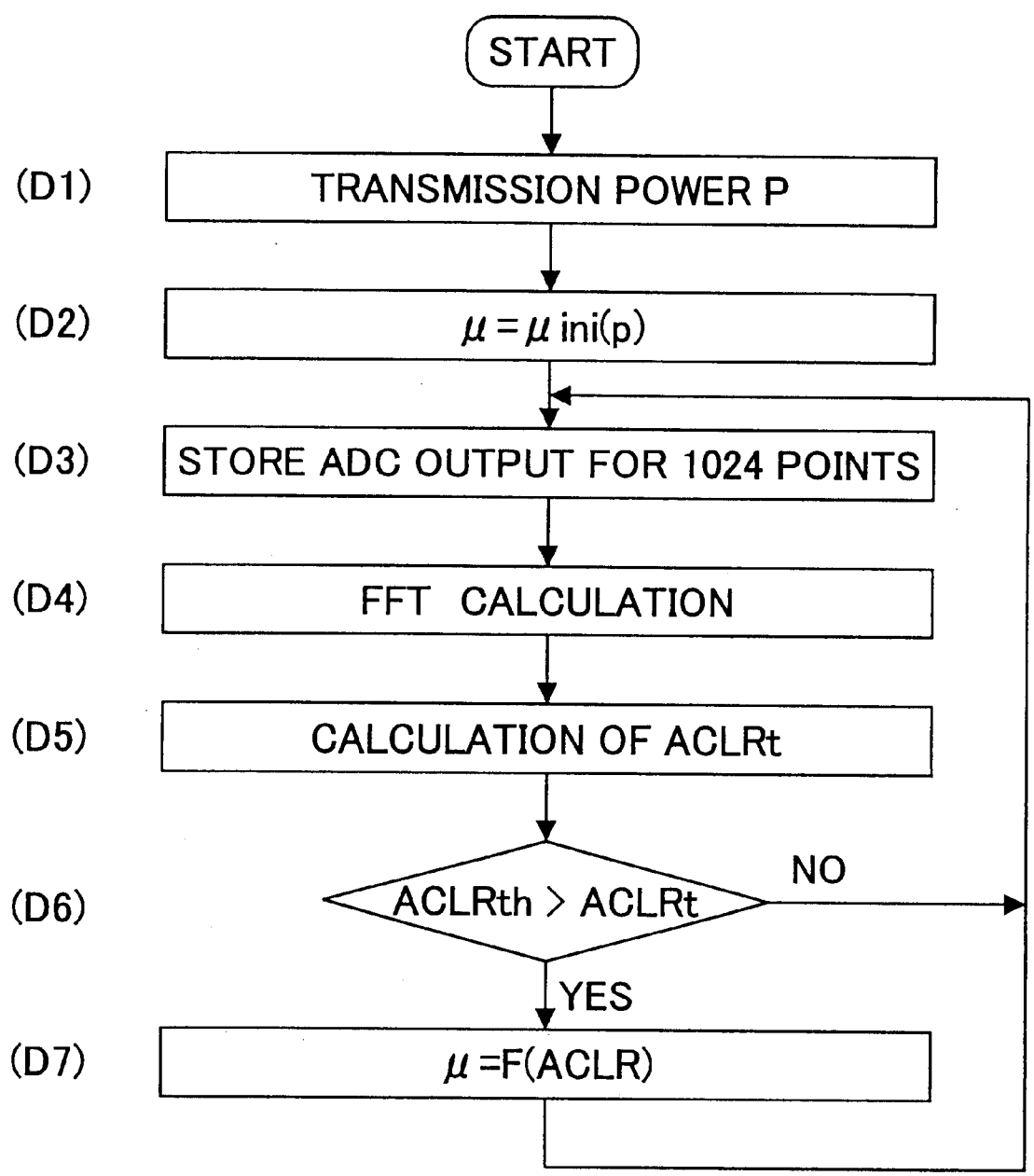
FIG. 14 is a flow chart of the third embodiment of the present invention.

FIG. 14 is a flow chart of a third embodiment of the present invention. When the desired transmission power value is set to p (D1), the initial value setting part 31 sets the initial value of the step size parameter $\mu$ to $\mu=\mu$ini (p) (D2), and lets the $\mu$ adjusting part 24 control the step size parameter $\mu$. Additionally, the fast Fourier transformation part 22 stores 1024 outputs from the A/D converter 10 corresponding to 1024 sampling points (D3), performs a fast Fourier transformation calculation (D4), and the calculation part 23 calculates ACLRt (D5). The $\mu$ adjusting part 24 compares the threshold value ACLRth from the threshold value setting part 32 with the calculated ACLRt (D6). When the ACLRt becomes smaller than the threshold value, the step size parameter $\mu$ is varied according to the function F(ACLR), for example (D7), and the $\mu$=F(ACLR) that is varied from the initial value $\mu=\mu$ini (p) is input to the multiplier 13.

Figure 15:
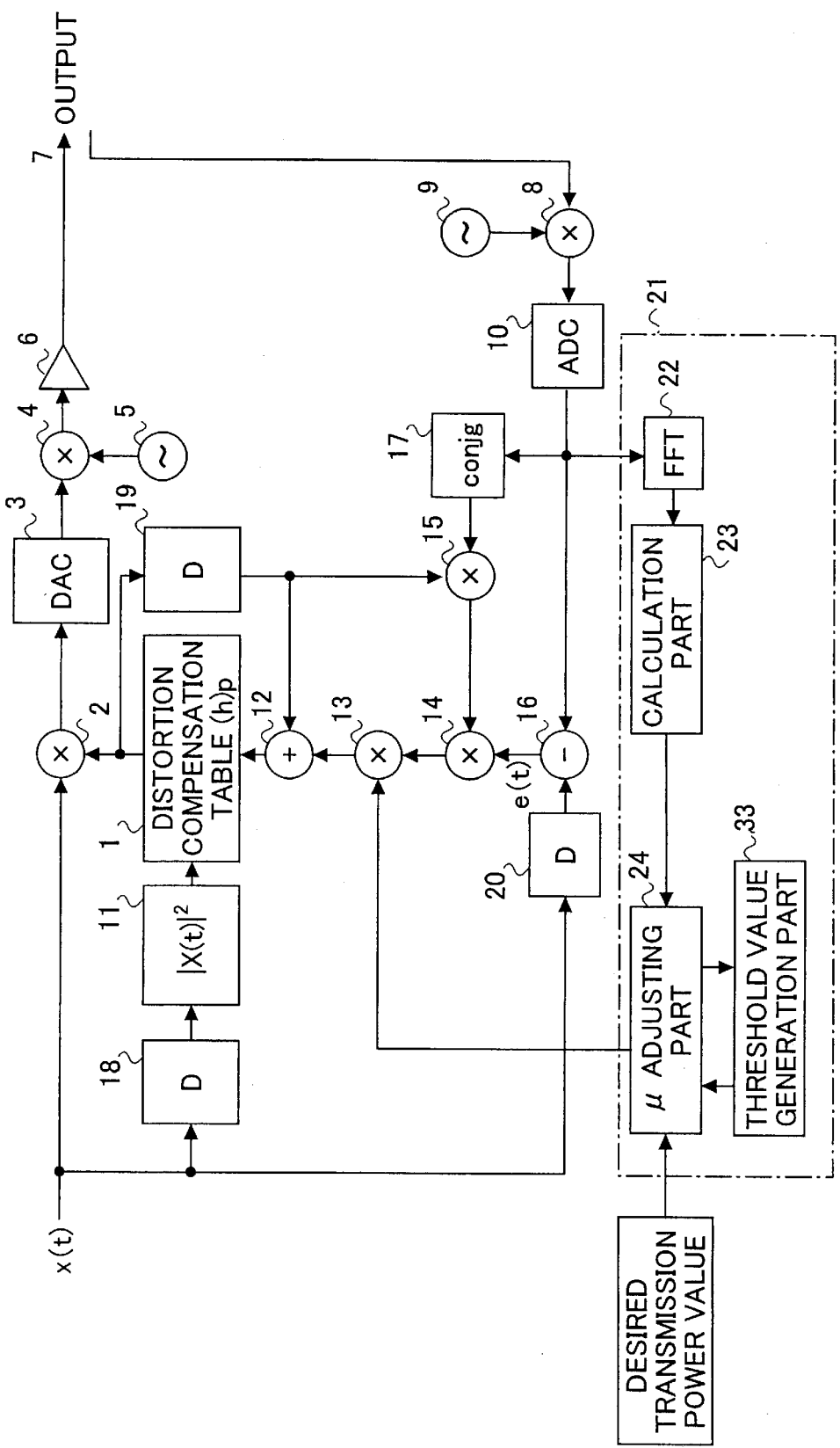
FIG. 15 is a block diagram of a fourth embodiment of the present invention.

FIG. 15 is an explanatory diagram of a fourth embodiment of the present invention. In FIG. 15, those parts which are designated by the same reference numerals in FIGS. 7, 10, 13 correspond to the same parts in FIGS. 7, 10, 13. Thus, an overlapping explanation of the parts having the same function will be omitted. In this embodiment, the desired transmission power value is input t the $\mu$ adjusting part 24. Additionally, a threshold value generation part 33 generates the threshold value corresponding to the transmission power value and ACLRt from the calculation part 23, and inputs the threshold value to the $\mu$ adjusting part 24.

Figure 16:
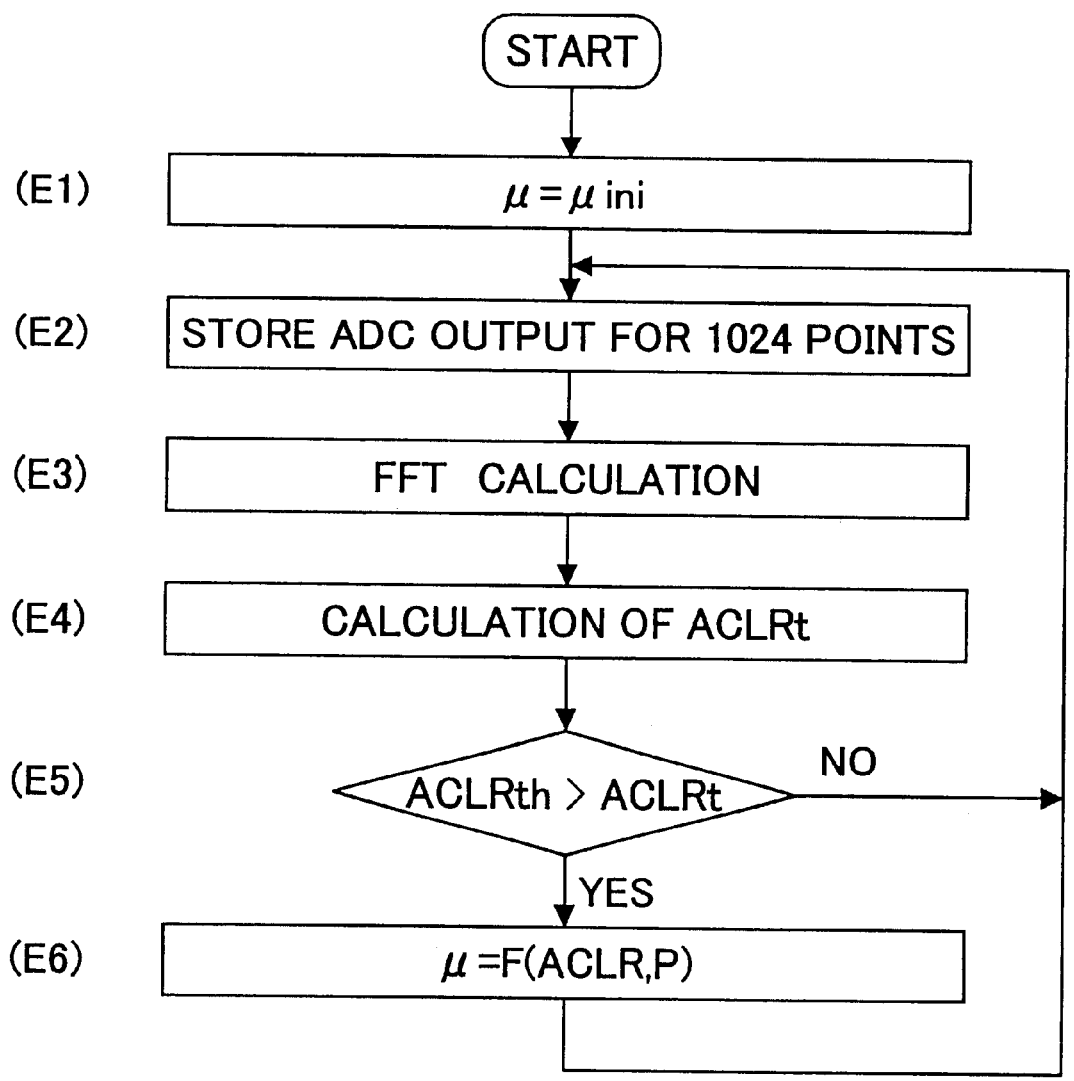
FIG. 16 is a flow chart of the fourth embodiment of the present invention.

FIG. 16 is a flow chart of a fourth embodiment of the present invention. The initial value of the step size parameter $\mu$ is set to $\mu=\mu$ini (E1). The fast Fourier transformation part 22 stores 1024 outputs from the A/D converter 10 corresponding to 1024 sampling points (E2), and performs a fast Fourier transformation calculation (E3). The calculation part 24 calculates ACLRt (E4). The $\mu$ adjusting part 24 compares the calculated ACLRt with the threshold value ACLRth (E5). When ACLRt becomes smaller, the step size parameter $\mu$ is varied so as to correspond to ACLRt and the desired transmission power value P as shown by a function $\mu$=F (ACLR, P) (E6). That is, the threshold value generating part 33 inputs the threshold value ACLRth to the $\mu$ adjusting part 24. The threshold value ACLRth thereof corresponds to the calculated ACLRt and the desired transmission power value P. For this reason, it is possible to control the step size parameter $\mu$ as a function of ACLRt and the desired, transmission power value P.

Figure 17:
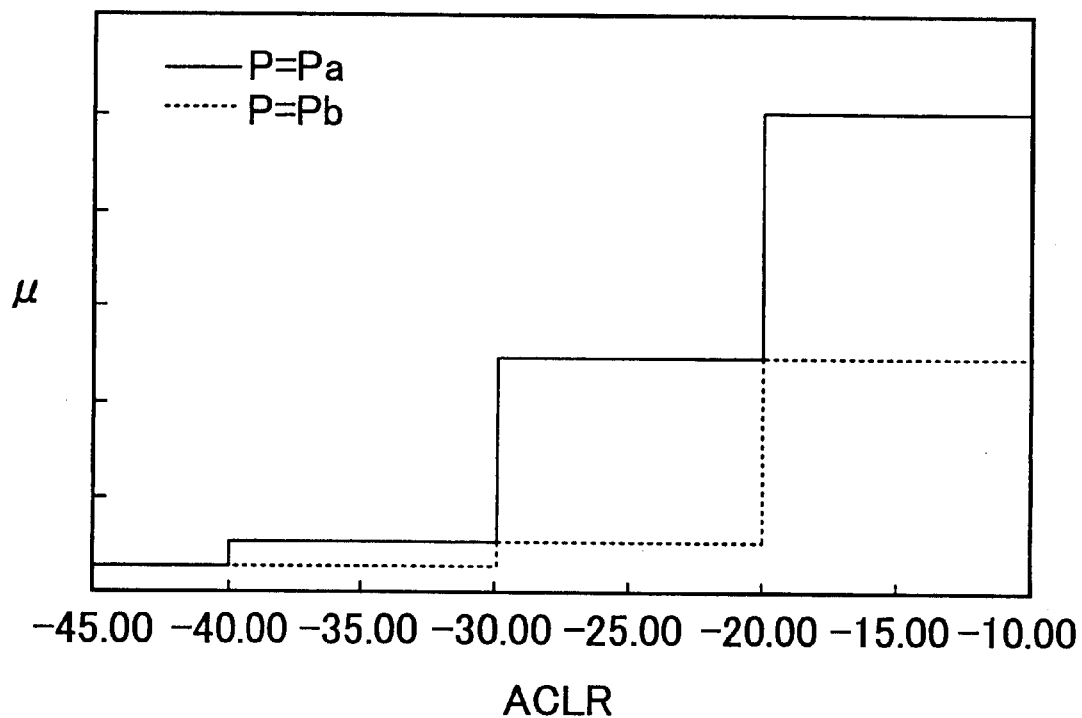
FIG. 17 is a graph for illustrating the relationship between the step size parameter $\mu$ and the ACLR (adjacent channel leakage power ratio)

FIG. 17 is an explanatory diagram of an example of a relationship between $\mu$ and ACLR. A continuous line represents the transmission power P=Pa [dBm], and a broken line represents the lower transmission power P=Pb [dBm]. At the starting point of the distortion compensation control, a value of ACLR is large. However, when the desired transmission power is small, the power amplifier 6 operates in an area in which the distortion is little compared with when the transmission power is large. Thus, as shown by the broken line, the distortion compensation control is started by making the initial value of the step size parameter $\mu$ small. Thereby, it is possible to speed up the convergence. In this case, the step size parameter $\mu$ is selected from four types. However, it is also possible to select the step size parameter $\mu$ from many more types, or to control the step size parameter $\mu$ to vary linearly or curvilinearly.

Figure 18:
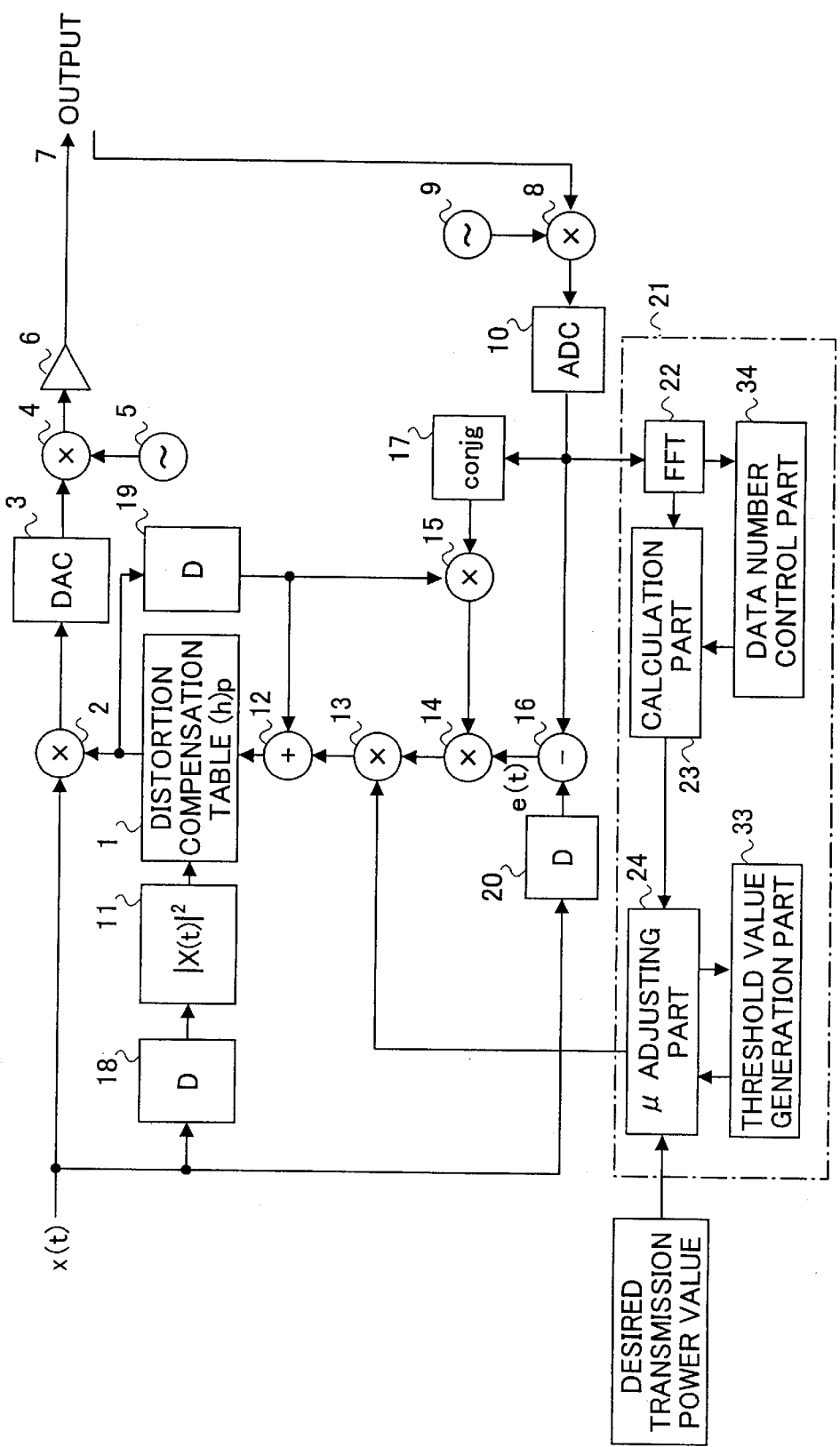
FIG. 18 is a block diagram of a fifth embodiment of the present invention.

FIG. 18 is an explanatory diagram of a fifth embodiment of the present invention. In FIG. 18, those parts which are designated by the same reference numerals in the above mentioned embodiments correspond to the same parts in the above mentioned embodiments. Thus, an overlapping explanation of the parts having the same function will be omitted. In this embodiment, a data number control part 34 controls the number of data N on which the fast Fourier transformation is performed in such a manner that the number N is small at the starting point of the distortion compensation control and the number N becomes larger as the distortion compensation control converges.

Figure 19:
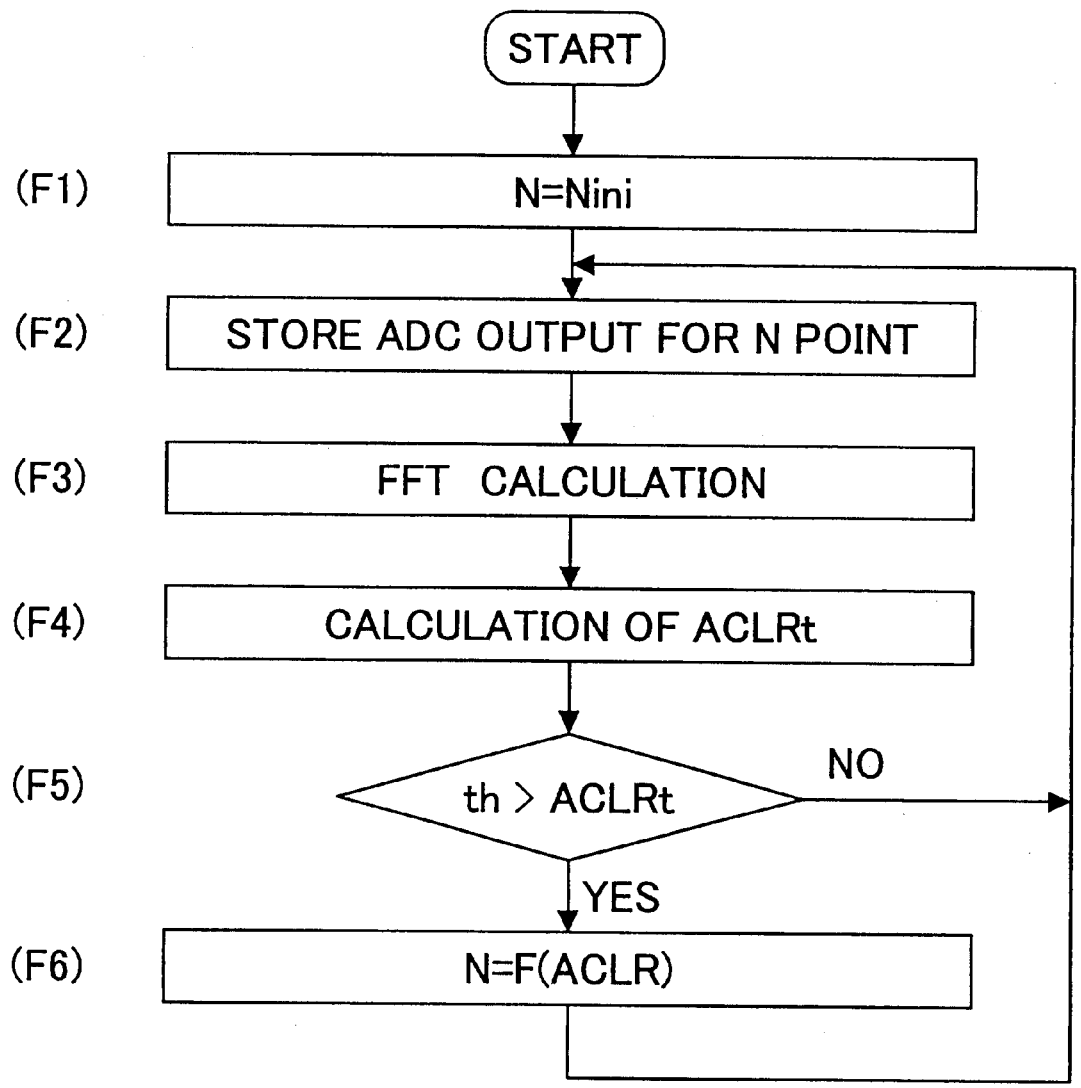
FIG. 19 is a flow chart of the fifth embodiment of the present invention.

FIG. 19 is a flow chart of the fifth embodiment of the present invention. The data number control part 34 set an initial value of the number of data N for calculating at the fast Fourier transformation part 22 to the minimum value such as 32, for example (N=Nini) (F1). The fast Fourier transformation part 22 stores the outputs of the A/D converter 10 for N points (F2), and performs an FFT calculation (F3). Since the number of data N is small, it is possible to perform the FFT calculation at high speed.

The calculation part 23 calculates ACLRt based on a result of the FFT calculation (F4). The data number control part 34 compares the calculated ACLRt with the threshold value ACLRth (F5), and varies the number of data N to a large value when ACLRt becomes small (F6). In this case, the number of data N is varied according to a function F(ACLR).

Figure 20:
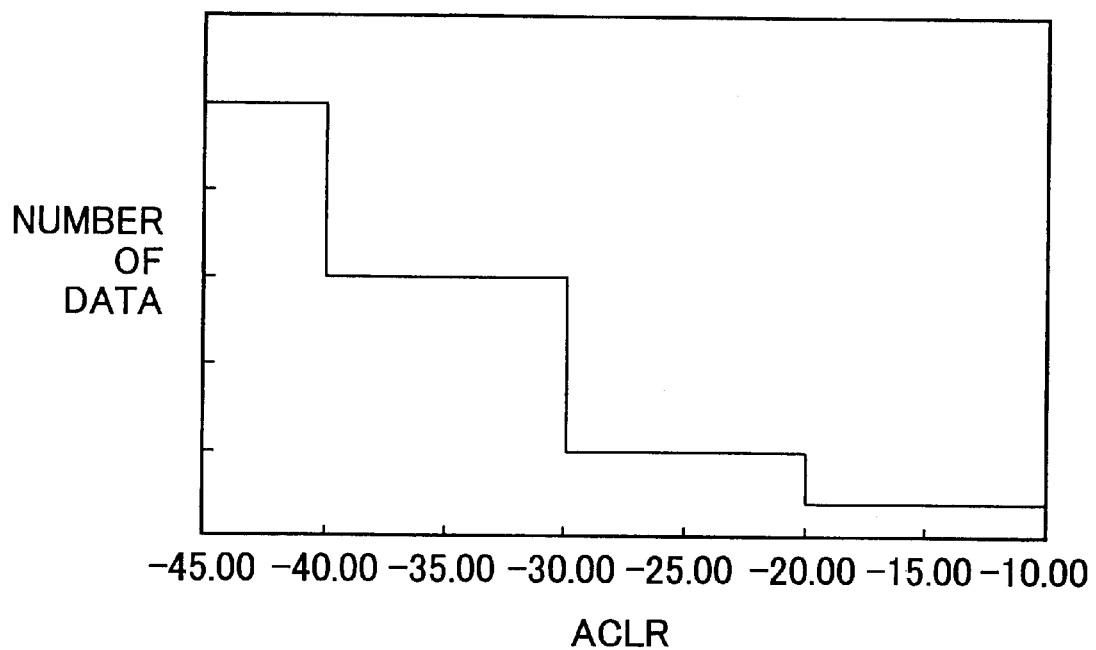
FIG. 20 is a graph for illustrating the relationship between the number of data for FFT calculation and the ACLR.

The relationship between the number of data N and ACLR can be controlled as shown in FIG. 20. That is, when ACLR has an inferior value such as approximately −10 [dB], the number of data N for FFT calculation can be set to Nini=32. When ACLR is approximately −20 [dB], the number of data N can be set to N=64, when ACLR is approximately −30 [dB], the number of data N=512, and when ACLR is approximately −40 [dB], the number of data N can be set to N=1024. Further, it is also possible to use many more numbers of data. Additionally, it should be noted that the value of ACLR is not limited to the values mentioned in the above embodiments.

Figure 21:
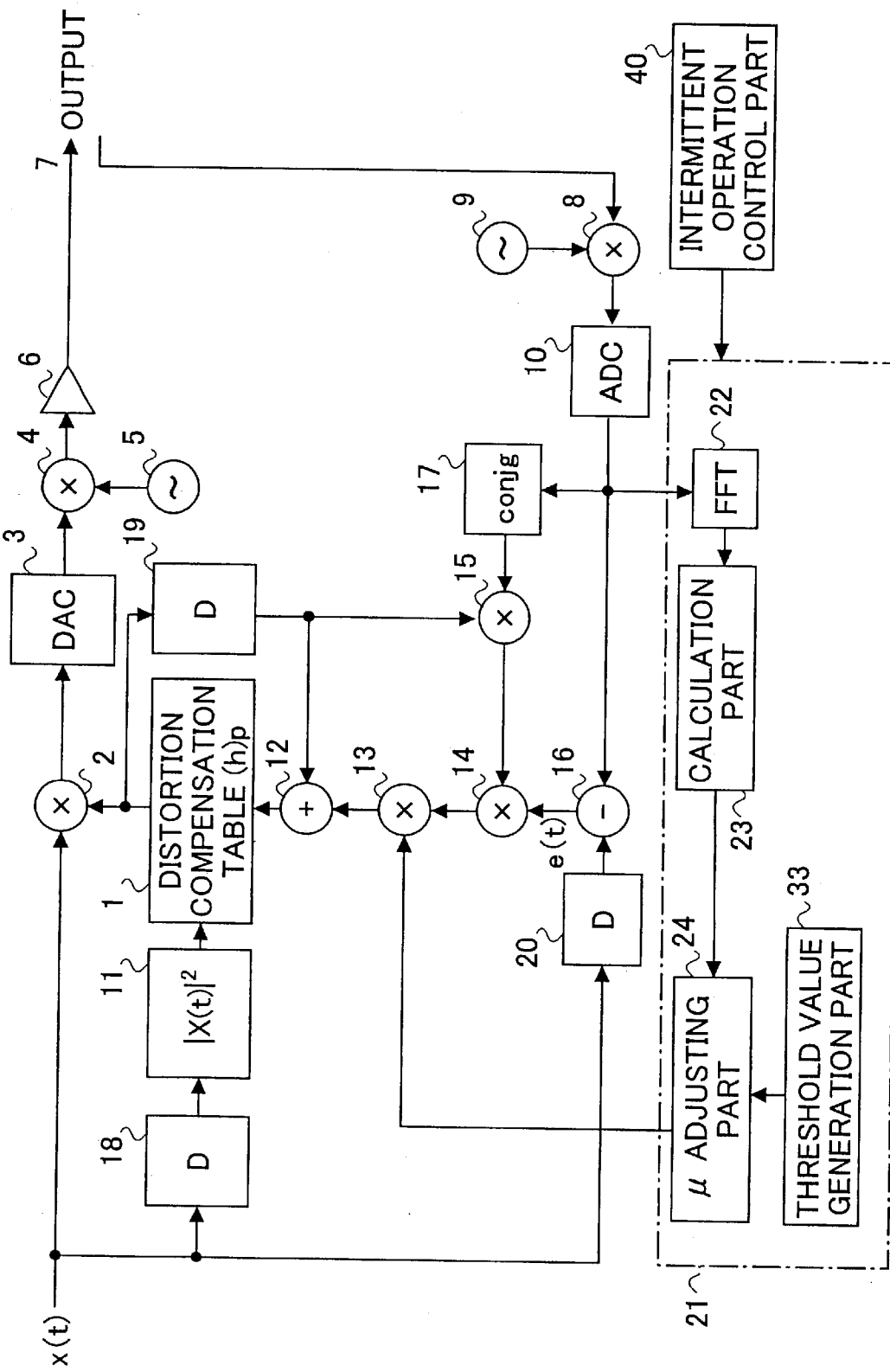
FIG. 21 is a block diagram of a sixth embodiment of the present invention.

FIG. 21 is an explanatory diagram of a sixth embodiment of the present invention. In FIG. 21, those parts which are designated by the same reference numerals in FIG. 15 correspond to the same parts in FIG. 15. Thus, an overlapping explanation of the parts having the same function will be omitted. In this embodiment, a case is shown where an intermittent operation control part 40 is provided so as to operate the $\mu$ control part 21 intermittently. The $\mu$ control part 21 can employ the structures of $\mu$ control part 21 of the above mentioned embodiments.

Figure 22:
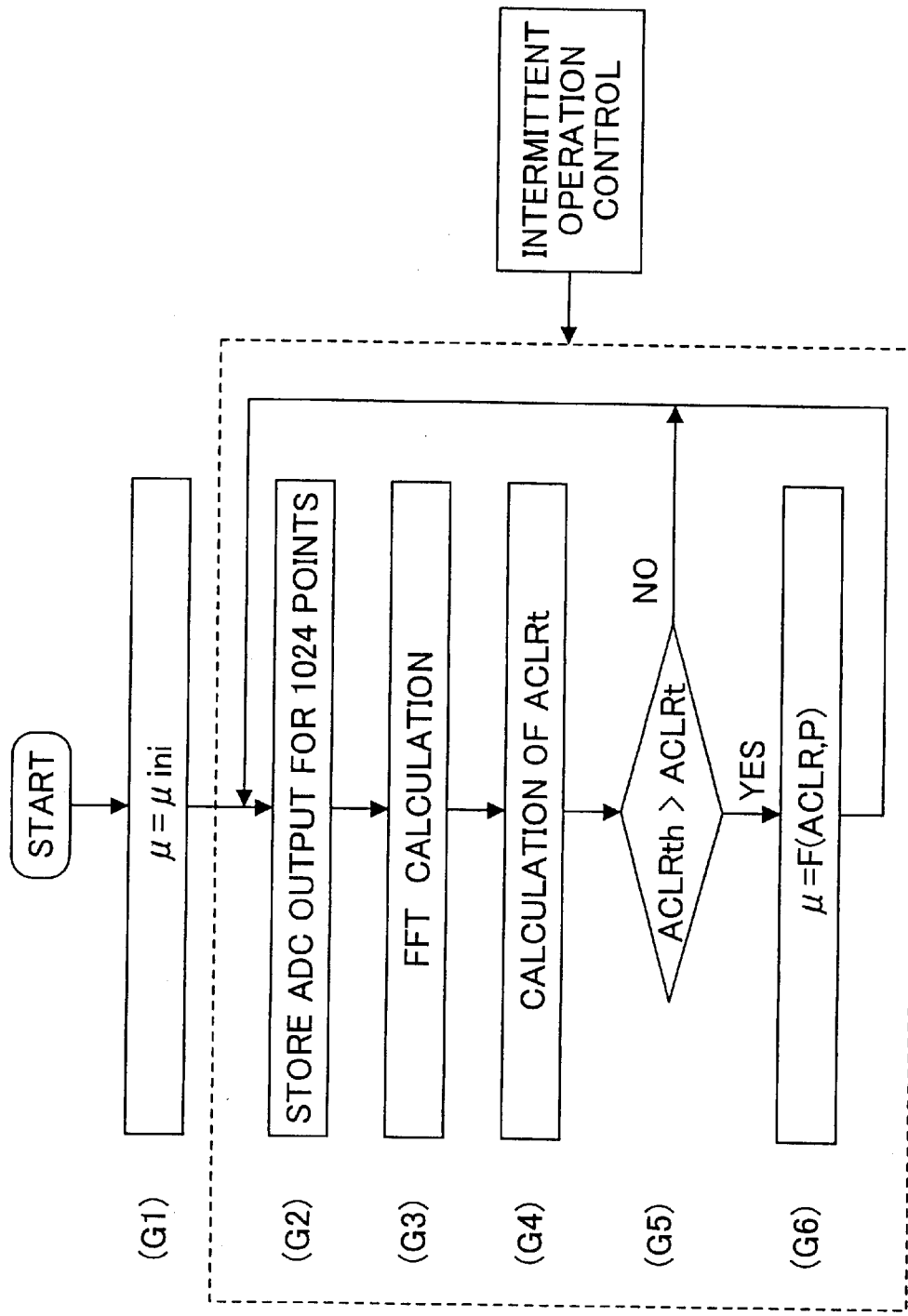
FIG. 22 is a flow chart of the sixth embodiment of the present invention.

FIG. 22 is a flow chart of the sixth embodiment of the present invention. Steps (G1) through (G6) are the same as steps (E1) through (E6) of the embodiment shown in FIG. 16. Additionally, steps (G2) through (G6) represent the operation of the $\mu$ control part 21. The $\mu$ control part 21 is operated intermittently by the intermittent operation control part 40. That is, only the control of whether or not to vary the step size parameter $\mu$ is operated intermittently so as to reduce power consumption. Further, it is also possible to perform the intermittent operation after the conversion, while performing a continuous operation at the starting point of the distortion compensation control.

Figure 23:
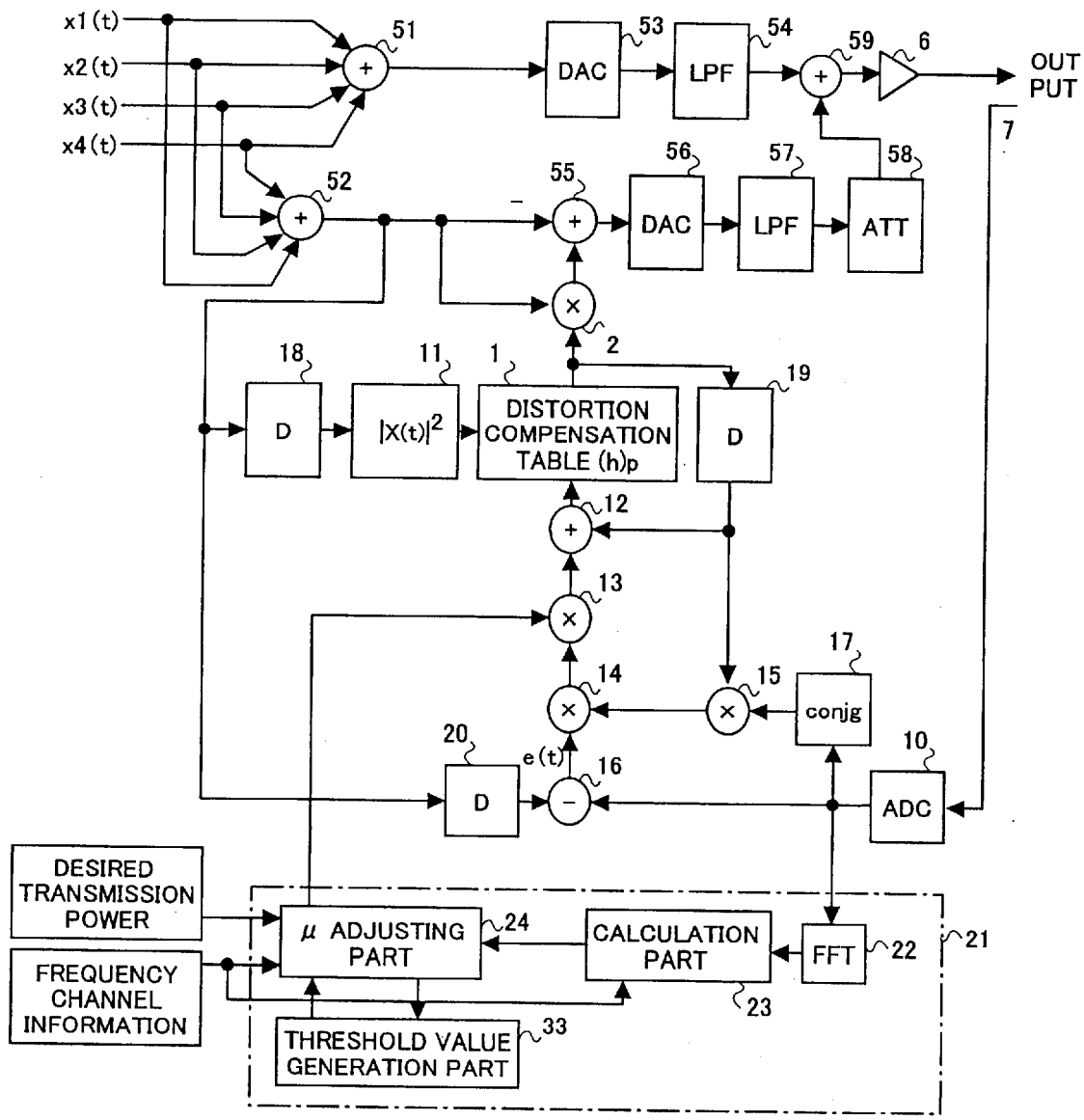
FIG. 23 is a block diagram of a seventh embodiment of the present invention.

FIG. 23 is an explanatory diagram of a seventh embodiment of the present invention. In FIG. 22, those parts which are designated by the same reference numerals in the above mentioned embodiments correspond to the same parts in the above mentioned embodiments. Thus, an overlapping explanation of the parts having the same function will be omitted. In this embodiment, a case is shown where transmission signals of a plurality of channels x1(t), x2(t), x3(t) and x4(t) are amplified by the power amplifier 6 and transmitted. Further, in FIG. 23, illustrations of a means which modulates a signal by a transmission frequency and a means which returns a part of the amplified output signal through the directional coupler 7 and modulates the returned signal to an intermediate frequency are omitted.

Additionally, a distortion compensation apparatus shown in FIG. 23 includes a first combining part 51, a second combining part 52, a D/A converter (DAC) 53, a low-pass filter (LPF) 54, an adder 55, a D/A converter (DAC) 56, a low-pass filter (LPF) 57, an attenuator (ATT) 58, and an adder 59. Further, the desired transmission power value is input to the $\mu$ adjusting part 24, and frequency channel information is input the $\mu$ adjusting part 24 and the calculation part 23.

When transmitting the transmission signals x1(t), x2(t), x3(t) and x4(t) as four carriers, the first combining part 51 combines the transmission signals, the D/A converter 53 converts the combined signal thereof into an analog signal. Then, the low-pass filter 54 eliminates an unnecessary band component from the analog signal, and the adder 59 adds the analog signal thereof and a signal for pre-distortion a level of which is adjusted. The thus obtained signal is input to the power amplifier 6.

The power amplifier 6 amplifies and transmits the transmission signal that is equivalent to four carriers to an antenna (not shown). Additionally, a part of the signal is branched by the directional coupler 7. The branched signal is input to the A/D converter 10 and converted to a digital signal.

Additionally, the adder 55 generates the distortion compensation signal using the transmission signal combined by the second combining part 52. As already explained in the above-mentioned linealizer, the multiplier 2 outputs the transmission signal to which the pre-distortion is given. The adder 55 obtains a difference between the transmission signal having the pre-distortion and the transmission signal combined by the combining part 52, and outputs only a signal of the distortion compensation component. Then, the D/A converter 56 converts the distortion compensation signal into an analog signal. The low-pass filter 57 eliminates an unnecessary component from the signal. The attenuator 58 attenuates the level of the signal to a desired level and inputs the signal thereof to the adder 59. Thereby, it is possible to give the pre-distortion to the transmission signal from the low-pass filter 54 and input the transmission signal thereof to the power amplifier 6.

In addition, in order to form the distortion compensation signal, the branched signal is converted into a digital signal by the A/D converter 10, and the digital signal is input to the subtractor 16 and the complex number converter 17. Additionally, the fast Fourier transformation part 22 of the $\mu$ control part 21 performs a Fourier transformation based on a digital signal of 1024 points, for example, and obtains a spectrum of the transmission signal. The calculation part 23 obtains an accurate adjacent channel leakage power ratio. The step size parameter $\mu$ is controlled based on the adjacent channel leakage power ratio. Such a control of the step size parameter $\mu$ is the same as the control in each of the above-described embodiments. Further, in this embodiment, the distortion compensation apparatus is structured in such a manner that the transmission signal combined by the first-combining part 51 and the transmission signal combined by the second combining part 52 are divided, the adder 55 outputs the distortion compensation signal, and the adder 59 adds the transmission signal combined by the first combining part 51 and the distortion compensation signal. For this reason, it is possible to effectively perform power amplification by the distortion compensation of a plurality of carriers.

Figure 24:
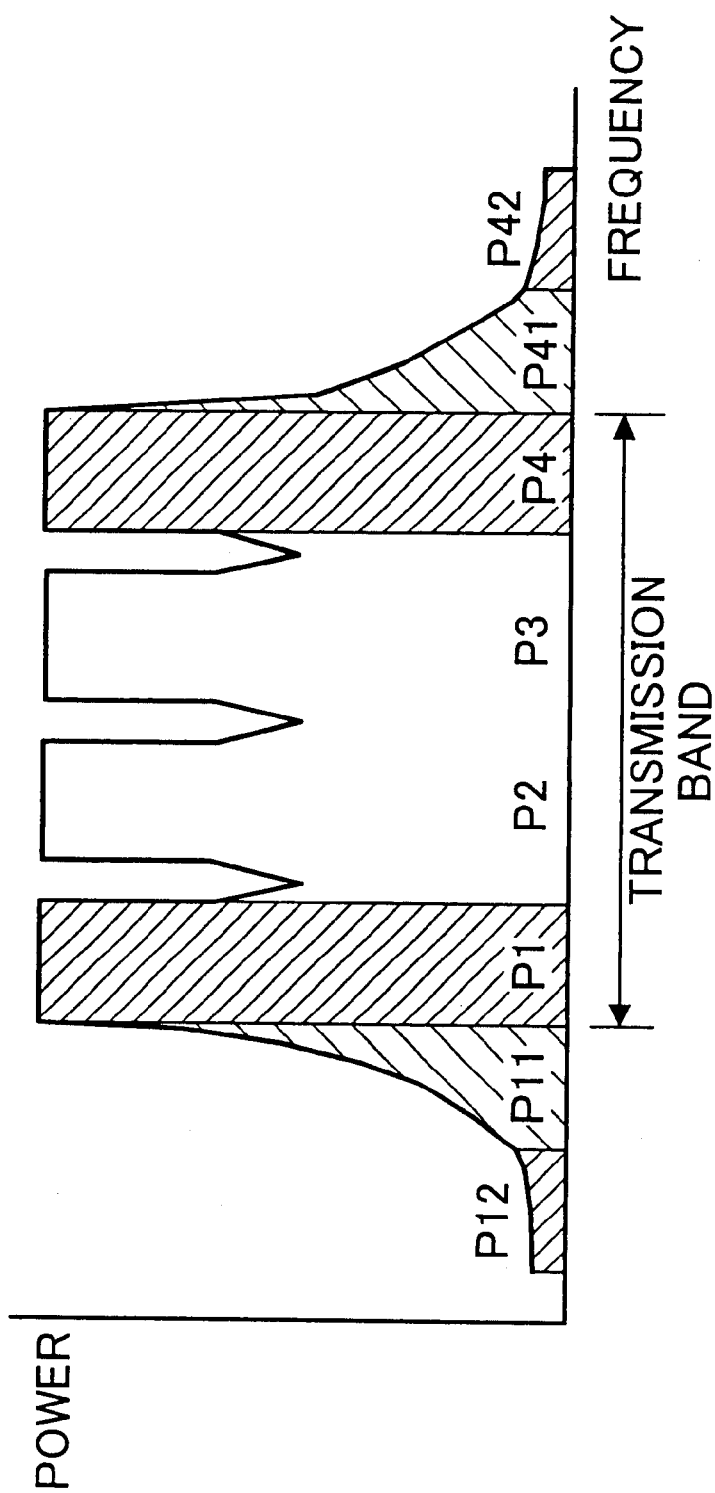
FIG. 24 is a graph of a spectrum of four carriers.

When the power amplifier 6 amplifies and transmits the transmission signals x1(t) through x4(t) of the above mentioned four carriers, a part of the amplified output signal is returned, the A/D converter performs AD conversion to the returned signal thereof, and the fast Fourier transformation part 22 performs a Fourier transformation process to the converted signal. Thus, a spectrum shown in FIG. 24, for example, is obtained. In FIG. 24, P1, P2, P3 and P4 represent the respective power of each carrier, P11 represents leakage power of an adjacent channel having a lower frequency than the transmission band, P12 represents leakage power of a channel having a further lower frequency. Similarly, P41 represents leakage power of an adjacent channel having a higher frequency than the transmission band, and P42 represents leakage power of a channel having a further higher frequency.

The calculation part 23 determines the transmission channel from the spectrum based on frequency channel information. For example, adjacent channel leakage power ratios at time t ACLR11t and ACLR12t are calculated as ACLR11t=P11/P1, ACLR12t=P12/P1, respectively. In the same way, adjacent channel leakage power ratios at time t ACLR41t and ACLR42t are calculated as ACLR41t=P41/P4, ACLRt42t=P42/P4, respectively. Then, in order to control the step size parameter $\mu$, the $\mu$ adjusting part 24 can use only the adjacent channel leakage power ratio of the lower frequency than the transmission band, or only the adjacent channel leakage power ratio of the higher frequency. It is also possible to use an average value of ACLR11t and ACLR41t, and an average value of ACLR12t and ACLR42t. Additionally, for example, it is also possible to control the step size parameter $\mu$ by weighting ACLR11t and ACLR12t.

Further, the $\mu$ adjusting part 24 can output the initial value of the step size parameter $\mu$ based on the desired transmission power value, input the initial value thereof to the multiplier 13, switch the step size parameter $\mu$ according to a status of the distortion compensation, and resume the distortion compensation control by returning the step size parameter $\mu$ to the initial value every time the transmission power value is varied. Additionally, the threshold value generating part 33 is structured by such as the table or function generator as mentioned above. The threshold value generating part 33 varies the threshold value based on a calculated ACLRt at present time t. The $\mu$ adjusting part 24 compares the threshold value thereof with ACLRt and switches the step size parameter $\mu$.

Further, in the present invention, it is possible to structure the delay circuits 18 through in the above mentioned embodiments such that the delay time of each delay circuit can be controlled. Additionally, it is also possible to use any other parameter than the parameter $\mu$.

The present invention is not limited to the specifically disclosed embodiments, and variations and modifications may be made without departing from the scope of the present invention.

The present application is based on a Japanese priority application No. 2001-334577 filed on Oct. 31, 2001, the entire contents of which are hereby incorporated by reference.

What is claimed is:

1. A distortion compensation apparatus that returns a part of an amplified output signal of a power amplifier amplifying a transmission signal, reads a distortion compensation signal from a distortion compensation table, multiplies the transmission signal with the distortion compensation signal, and inputs the multiplied signal to the power amplifier, the distortion compensation signal corresponding to a signal calculated based on an error signal that is a difference between the transmission signal and the amplified output signal, the distortion compensation signal from the distortion compensation table and a step size parameter, and to a power of the transmission signal, the distortion compensation apparatus comprising:

a $\mu$ control part including a fast Fourier transformation part that obtains a spectrum of the amplified output signal, a calculation part that calculates an adjacent channel leakage power ratio based on the spectrum, and a $\mu$ adjusting part that varies the step size parameter by comparing the calculated adjacent leakage power ratio with a threshold value.

2. The distortion compensation apparatus as claimed in claim 1, wherein the $\mu$ control part includes a threshold value generation part that outputs a threshold value corresponding to the adjacent channel leakage power ratio, and the $\mu$ adjusting part selects and outputs the step size parameter corresponding to the threshold value by comparing the threshold value from the threshold value generation part with the adjacent channel leakage power ratio.

3. The distortion compensation apparatus as claimed in claim 1, wherein the $\mu$ adjusting part of the $\mu$ control part selects and outputs an initial value of the step size parameter corresponding to a desired transmission power value.

4. The distortion compensation apparatus as claimed in claim 2, wherein the threshold value generation part obtains and outputs the step size parameter using a desired power value and the adjacent channel leakage power ratio as variables.

5. The distortion compensation apparatus as claimed in claim 1, wherein the $\mu$ control part includes a data number control part that varies the number of data to a small number when the adjacent channel leakage power ratio is large, and to a large number when the adjacent channel leakage power ratio is small, the data being stored and performed to a Fourier transformation by the fast Fourier transformation part.

6. The distortion compensation apparatus as claimed in claim 1, comprising an intermittent operation control part that operates the $\mu$ control part intermittently.

7. A distortion compensation apparatus that returns a part of an amplified output signal of a power amplifier amplifying a transmission signal of a plurality of carriers by a first combining part, reads a distortion compensation signal from a distortion compensation table, multiplies the transmission signal with the distortion compensation signal, adds the transmission signal combined by the first combining part to the distortion compensation signal, the compensation signal being a difference between the multiplied output signal and the transmission signal combined by a second combining part, and inputs the multiplied signal to the power amplifier, the distortion compensation signal corresponding to a signal calculated based on an error signal of a difference between the returned signal and the transmission signal obtained by combining the transmission signals of the plurality of carriers by the second combining part, the distortion compensation signal from the distortion compensation table and a step size parameter, and to a power of the transmission signal combined by the second combining part, the distortion compensation apparatus comprising:

a $\mu$ control part including a fast Fourier transformation part that obtains a spectrum of the amplified output signal, a calculation part that calculates an adjacent channel leakage power ratio based on the spectrum, a $\mu$ adjusting part that varies the step size parameter by comparing the calculated adjacent channel leakage power ratio with a threshold value.

8. A distortion compensation method that returns a part of an amplified output signal of a power amplifier amplifying a transmission signal, reads a distortion compensation signal from a distortion compensation table, multiplies the transmission signal with the distortion compensation signal, and inputs the multiplied signal to the power amplifier, the distortion compensation signal corresponding to a signal calculated based on an error signal that is a difference between the transmission signal and the amplified output signal, the distortion compensation signal from the distortion compensation table and a step size parameter, and to a power of the transmission signal, the distortion compensation method comprising the steps of:

obtaining a spectrum of the amplified output signal;

calculating an adjacent channel leakage power ratio based on the spectrum;

comparing the adjacent channel leakage power ratio with a threshold value; and switching the step size parameter to a small value when the adjacent channel leakage power ratio becomes smaller than the threshold value.

9. The distortion compensation method as claimed in claim 8, further comprising the steps of:

varying the threshold value continuously or intermittently according to a value of the adjacent channel leakage power ratio;

comparing the threshold value thereof with the adjacent channel leakage power ratio; and varying the step size parameter.

10. The distortion compensation method as claimed in claim 8, further comprising the step of:

starting a distortion compensation control having a value corresponding to a desired transmission power value as an initial value of the step size parameter.

11. The distortion compensation method as claimed in claim 8, further comprising the step of:

generating the threshold value by using the adjacent channel leakage power ratio and a desired power value as variables, the threshold value being compared with the adjacent channel leakage power ratio.

12. The distortion compensation method as claimed in claim 8, further comprising the steps of:

changing the number of data to a small number when the adjacent channel leakage power ratio is large, and to a large number when the adjacent channel leakage power ratio is small, the data being used for obtaining the spectrum of the amplified output signal; and performing a Fourier transformation process in order to calculate the adjacent channel leakage power ratio.

13. The distortion compensation method as claimed in claim 8, further comprising the step of:

intermittently performing a process that obtains the step size parameter with a predetermined time interval.

14. A distortion compensation apparatus that returns a part of an amplified output signal of a power amplifier amplifying signals of a plurality of carriers by a first combining part, reads a distortion compensation signal from a distortion compensation table, multiplies the transmission signal with the distortion compensation signal thereof, adds the transmission signal combined by the first combining part to the distortion compensation signal, the compensation signal being a difference between the multiplied output signal and the transmission signal combined by a second combining part, and inputs the signal to the power amplifier, the distortion compensation signal corresponding to a signal calculated based on an error signal of a difference between the returned signal and the transmission signal obtained by combining the transmission signals of the plurality of carriers by the second combining part, the distortion compensation signal from the distortion compensation table and a step size parameter, and to a power of the transmission signal combined by the second combining part, the distortion compensation method comprising the steps of:

obtaining a spectrum of the amplified output signal;

calculating an adjacent channel leakage power ratio based on the spectrum;

comparing the calculated adjacent channel leakage power ratio with a threshold value; and varying the step size parameter.

15. A distortion compensation apparatus comprising:

a radio unit including a power amplifier amplifying a transmission signal to output an amplified output signal;

a feedback path connected to an output of the power amplifier and providing the amplified output signal;

a distortion compensation signal generating unit generating a distortion compensation signal based on both an error signal indicating a difference between the transmission signal and the amplified output signal, and a step size parameter $\mu$;

a distortion compensation signal memory defining correspondence of the distortion compensation signal to a calculated power of the transmission signal;

a multiplier multiplying the transmission signal with the distortion compensation signal output from the distortion compensation signal memory, to supply the multiplied signal to an input of the power amplifier; and a $\mu$ adjusting unit varying the step size parameter $\mu$ based on a spectrum of the amplified output signal, to supply the varied step size parameter $\mu$ to the distortion compensation signal generating unit.

16. A distortion compensation method, comprising the steps of:

providing a power amplifier amplifying a transmission signal to output an amplified output signal, and providing a feedback path connected to an output of the power amplifier and supplying the amplified output signal;

generating a distortion compensation signal based on both an error signal indicating a difference between the transmission signal and the amplified output signal, and a step size parameter $\mu$;

providing a distortion compensation signal memory defining correspondence of the distortion compensation signal to a calculated power of the transmission signal;

multiplying the transmission signal with the distortion compensation signal output from the distortion compensation signal memory, to supply the multiplied signal to an input of the power amplifier; and varying the step size parameter $\mu$ based on a spectrum of the amplified output signal, to supply the varied step size parameter $\mu$ to the distortion compensation signal generating step.

* * * * *